United States Patent
Kim et al.

(10) Patent No.: US 12,056,319 B2
(45) Date of Patent: *Aug. 6, 2024

(54) ELECTRONIC DEVICE

(71) Applicant: SAMSUNG DISPLAY CO., LTD., Yongin-si (KR)

(72) Inventors: Jae-Kyoung Kim, Hwaseong-si (KR); Kiseo Kim, Yongin-si (KR); Wonsang Park, Yongin-si (KR); Bonghyun You, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 109 days.

This patent is subject to a terminal disclaimer.

(21) Appl. No.: 17/454,075

(22) Filed: Nov. 9, 2021

(65) Prior Publication Data

US 2022/0069019 A1 Mar. 3, 2022

Related U.S. Application Data

(63) Continuation of application No. 16/933,026, filed on Jul. 20, 2020, now Pat. No. 11,169,644.

(30) Foreign Application Priority Data

Nov. 5, 2019 (KR) .................. 10-2019-0140246

(51) Int. Cl.
*G06F 3/044* (2006.01)
*H01Q 1/24* (2006.01)
*H01Q 1/27* (2006.01)
*H01Q 1/36* (2006.01)
*H10K 50/84* (2023.01)
*H10K 50/844* (2023.01)
*H10K 59/12* (2023.01)
(Continued)

(52) U.S. Cl.
CPC .......... *G06F 3/0443* (2019.05); *G06F 3/0446* (2019.05); *H01Q 1/243* (2013.01);
(Continued)

(58) Field of Classification Search
CPC ................ G06F 3/0443; G06F 3/0446; G06F 2203/04102; G06F 2203/04111;
(Continued)

(56) References Cited

U.S. PATENT DOCUMENTS 9,904,365 B2 2/2018 Son et al.
2011/0248940 A1 10/2011 Chuang et al.
(Continued)

FOREIGN PATENT DOCUMENTS

JP 3063826 7/2000
KR 10-2014-0100822 8/2014
(Continued)

*Primary Examiner* — Towfiq Elahi
(74) *Attorney, Agent, or Firm* — F. CHAU & ASSOCIATES, LLC

(57) ABSTRACT

An electronic device includes a display panel including a display region and a non-display region adjacent thereto, an input sensor overlapping a first region of the display region, and an antenna overlapping a second region of the display region. The input sensor includes a first sensing layer including a bridge pattern and a second sensing layer including sensor electrodes and disposed on a different layer from the first sensing layer. The bridge pattern connects two adjacent sensor electrodes. The antenna includes a first antenna layer including a first antenna with a first frequency band, the first antenna layer and the first sensing layer disposed on the same layer, and a second antenna layer including a second antenna with a second frequency band different from the first frequency band. The second antenna layer and the second sensing layer are disposed on the same layer.

13 Claims, 16 Drawing Sheets

(51) Int. Cl.
    *H10K 59/40*          (2023.01)
    *H10K 77/10*          (2023.01)
    *H10K 102/00*         (2023.01)
(52) U.S. Cl.
    CPC ............... *H01Q 1/273* (2013.01); *H01Q 1/36* (2013.01); *H10K 50/84* (2023.02); *H10K 50/844* (2023.02); *H10K 59/12* (2023.02); *H10K 59/40* (2023.02); *H10K 77/111* (2023.02); *G06F 2203/04102* (2013.01); *G06F 2203/04111* (2013.01); *G06F 2203/04112* (2013.01); *H10K 2102/311* (2023.02)
(58) Field of Classification Search
    CPC .......... G06F 2203/04112; H10K 59/40; H10K 50/84; H10K 77/111; H10K 50/844; H10K 59/12; H10K 2102/311; H01Q 1/243; H01Q 1/273; H01Q 1/36
    See application file for complete search history.

(56) References Cited

U.S. PATENT DOCUMENTS

| | | | |
|---|---|---|---|
| 2015/0185928 A1* | 7/2015 | Son | G06F 3/0445 345/174 |
| 2015/0255856 A1 | 9/2015 | Hong et al. | |
| 2016/0328057 A1* | 11/2016 | Chai | G06F 3/0412 |
| 2017/0139520 A1 | 5/2017 | Yeh et al. | |
| 2017/0205919 A1 | 7/2017 | Shibata et al. | |
| 2017/0245797 A1 | 8/2017 | Quinn | |
| 2017/0371452 A1 | 12/2017 | Endo et al. | |
| 2018/0314369 A1 | 11/2018 | Yashiro et al. | |
| 2019/0058264 A1 | 2/2019 | Jung et al. | |
| 2020/0019264 A1* | 1/2020 | Kadota | H10K 59/40 |
| 2020/0343314 A1 | 10/2020 | Nakamura et al. | |
| 2021/0005960 A1 | 1/2021 | Kida et al. | |
| 2021/0132736 A1 | 5/2021 | Kim et al. | |
| 2021/0382573 A1* | 12/2021 | Huh | H01Q 9/0407 |

FOREIGN PATENT DOCUMENTS

| | | | | |
|---|---|---|---|---|
| KR | 10-2015-0009031 A | 1/2015 | | |
| KR | 10-2015-0020006 A | 2/2015 | | |
| KR | 10-2015-0080228 | 7/2015 | | |
| KR | 10-2018-0026362 A | 3/2018 | | |
| KR | 10-1940797 | 1/2019 | | |
| KR | 10-2019-0019802 | 2/2019 | | |
| KR | 10-1962822 | 3/2019 | | |
| KR | 10-1985127 | 5/2019 | | |
| WO | WO-2010074262 A1 * | 7/2010 | ............ | H01Q 1/243 |
| WO | 2018173113 | 9/2018 | | |

\* cited by examiner

ELECTRONIC DEVICE

CROSS-REFERENCE TO RELATED APPLICATIONS

This U.S. non-provisional patent application is a continuation of U.S. application Ser. No. 16/933,026 filed Jul. 20, 2020, which claims priority under 35 U.S.C. § 119 of Korean Patent Application No. 10-2019-0140246, filed on Nov. 5, 2019, the entire contents of each of which are hereby incorporated by reference.

BACKGROUND

The present inventive concept relates to an electronic device, and more specifically to, an electronic device with an antenna.

An electronic device may include electronic modules. For example, the electronic device may be a portable terminal or a wearable device, and the electronic modules may include an antenna module, a camera module, or a battery module. As portable terminals become thinner and wearable devices become smaller, the space in which electronic modules are mounted is gradually reduced. Also, as electronic devices become highly functional and have more advanced specifications, the number of electronic modules included in electronic devices is increasing.

SUMMARY

The present disclosure provides an electronic device with improved antenna efficiency by respectively disposing first and second antennas which provide different frequency bands on upper and lower layers in a display region.

According to an embodiment of the present inventive concept, an electronic device includes a display panel including a display region and a non-display region adjacent to the display region, an input sensor overlapping a first region of the display region, and an antenna overlapping a second region of the display region. The input sensor includes a first sensing layer including a bridge pattern and a second sensing layer including a plurality of sensor electrodes and disposed on a different layer from the first sensing layer. The bridge pattern is configured to connect two adjacent sensor electrodes of the plurality of sensor electrodes. The antenna includes a first antenna layer including a first antenna with a first frequency band, the first antenna layer and the first sensing layer disposed on the same layer, and a second antenna layer including a second antenna with a second frequency band different from the first frequency band, the second antenna layer and the second sensing layer disposed on the same layer.

In an embodiment, the input sensor and the antenna further include a first insulation layer and a second insulation layer which covers the bridge pattern and the first antenna layer. The first antenna layer and the bridge pattern are disposed on the first insulation layer. The second antenna layer and the plurality of sensor electrodes are disposed on the second insulation layer.

In an embodiment, the electronic device further includes a third insulation layer covering the plurality of sensor electrodes and the second antenna layer.

In an embodiment, the display panel includes a thin film encapsulation layer. The input sensor and the antenna are disposed directly on an upper surface of the thin film encapsulation layer.

In an embodiment, the first antenna layer includes a first metal layer, a second metal layer on the first metal layer, and a third metal layer on the second metal layer. The second antenna layer includes a fourth metal layer and a fifth metal layer on the fourth metal layer.

In an embodiment, each of the first metal layer and the third metal layer is a titanium layer. The second metal layer is an aluminum layer. Each of the fourth metal layer and the fifth metal layer is a titanium layer or an aluminum layer.

In an embodiment, the first frequency band is smaller than the second frequency band.

In an embodiment, the first antenna layer includes a plurality of first antennas. The second antenna layer includes a plurality of second antennas.

In an embodiment, each of the plurality of second antennas overlaps a corresponding first antenna of the plurality of first antennas.

In an embodiment, each of the plurality of first antennas has an area greater than that of a corresponding second antenna of the plurality of second antennas.

In an embodiment, the thickness of each of the plurality of second antennas is less than the thickness of a corresponding first antenna element of the plurality of first antennas.

In an embodiment, the antenna further includes a plurality of transmission lines. Each of the plurality of transmission lines connects a corresponding one of the plurality of first antennas and a corresponding one of the plurality of second antennas.

In an embodiment, each of the first antenna and the second antenna comprises a mesh pattern.

In an embodiment, the display panel further includes a signal transmission region. On a plan view, the first region surrounds the signal transmission region. The second region is at least one of an upper left corner region of the display panel and an upper right corner region thereof.

According to an embodiment of the present inventive concept, an electronic device including a bending region and a non-bending region includes a display panel which includes a display region having a first region overlapping the non-bending region and a second region overlapping the bending region, and a non-display region adjacent to the display region, an input sensor disposed on the display panel and overlapping the first region, and an antenna disposed on the display panel and overlapping the second region. The input sensor includes a first insulation layer disposed directly on an upper surface of the display panel, a first sensing layer disposed on the first insulation layer, a second insulation layer covering the first sensing layer, and a second sensing layer disposed on the second insulation layer and having a plurality of sensors. The antenna includes a plurality of first antennas with a first frequency band, wherein the plurality of first antennas and the first sensing layer are disposed on the same layer, and a plurality of second antennas with a second frequency band. The plurality of second antennas and the second sensing layer are disposed on the same layer.

In an embodiment, the first frequency band is smaller than the second frequency band.

In an embodiment, each of the plurality of second antennas overlaps a corresponding first antenna of the plurality of first antennas.

In an embodiment, the input sensor comprises a plurality of first sensor electrodes arranged in a first direction, a plurality of first connecting electrodes, each of the plurality of first connecting electrodes configured to connect two respective first sensor electrodes, adjacent to each other, among the plurality of first sensor electrodes, a plurality of second sensor electrodes arranged in a second direction, and a plurality of second connecting electrodes, each of the plurality of second connecting electrodes configured to connect two respective second sensor electrodes, adjacent to each other, among the plurality of second sensor electrodes.

In an embodiment, the plurality of second connection electrodes are disposed on the first insulation layer. The second insulation layer is disposed on the plurality of second connection electrodes. The plurality of first sensor electrodes, the plurality of second sensor electrodes, and the plurality of first connection electrodes are disposed on the second insulation layer. Each of the plurality of first connection electrodes overlaps a respective second connection electrode of the plurality of second connection electrodes.

In an embodiment, the electronic device further includes a third insulation layer covering the plurality of first sensor electrodes, the plurality of second sensor electrodes, the plurality of first connecting electrodes, and the plurality of second antennas.

In an embodiment, each of the plurality of first antennas and each of the plurality of second antennas include mesh pattern.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
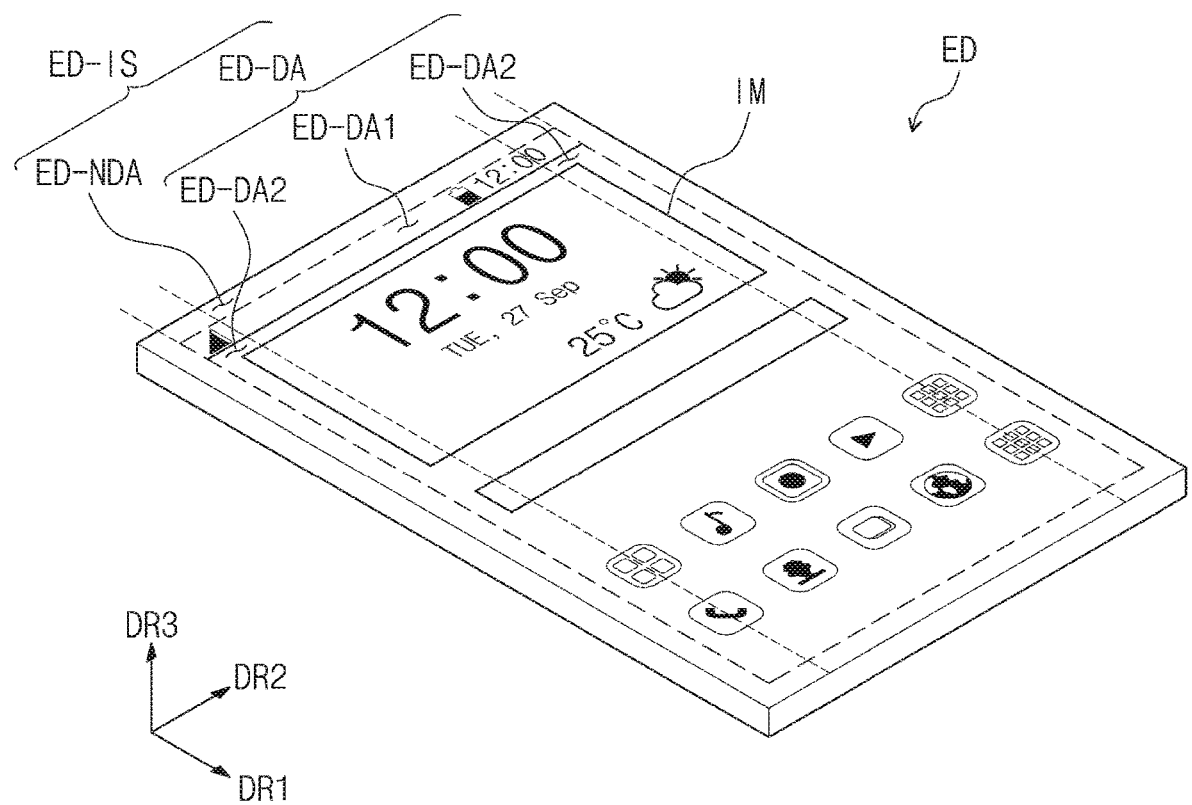
FIG. 1 is a perspective view of an electronic device according to an embodiment of the inventive concept.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thicknesses, the ratios, and the dimensions of elements may be exaggerated for an effective description of technical contents. The term "and/or," includes all combinations of one or more of which associated components may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

Hereinafter, embodiments of the inventive concept will be described with reference to the accompanying drawings.

FIG. 1 is a perspective view of an electronic device ED according to an embodiment of the inventive concept. As shown in FIG. 1, the electronic device ED may display an image IM through a display surface ED-IS. The display surface ED-IS is parallel to a plane defined by a first direction axis DR1 and a second direction axis DR2. The normal direction of the display surface ED-IS, for example, the thickness direction of the electronic device ED is indicated by a third direction axis DR3.

A front surface (or an upper surface) and a rear surface (or a lower surface) of each member or unit to be described hereinafter are distinguished by the third direction axis DR3. However, the first to third direction axes DR1, DR2, and DR3 shown in the present embodiment are merely exemplary. Hereinafter, first to third directions are directions indicated by the first to third direction axes DR1, DR2, DR3, respectively, and are given the same reference numerals.

In an embodiment of the inventive concept, the electronic device ED provided with a planar display surface is illustrated. However, the inventive concept is not limited thereto. In an embodiment, the electronic device ED may include a curved display surface or a three-dimensional display surface. The three-dimensional display surface may include a plurality of display regions emitting images in different directions, and may include, for example, a polygonal column type display surface.

The electronic device ED according to the present embodiment may be a rigid display device. However, the inventive concept is not limited thereto. In an embodiment, the electronic device ED may be a flexible electronic device ED. In the present embodiment, an electronic device ED applicable to a cell phone terminal is exemplarily illustrated. Although not illustrated, electronic modules, a camera module, a power module and the like mounted on a main board may be disposed in a bracket/case and the like together with the electronic device ED to configure the cell phone terminal. The electronic device ED according to the inventive concept may be applied to large electronic devices such as a television and a monitor, and small and medium-sized electronic devices such as a tablet, a car navigation system unit, a game machine, and a smart phone.

As shown in FIG. 1, the display surface ED-IS includes an image region ED-DA on which an image IM is displayed, and a bezel region ED-NDA adjacent to the image region ED-DA. The bezel region ED-NDA is a region on which an image is not displayed. In an embodiment, the image region of the display surface may correspond to a display region, and the display region may include a first region ED-DA1 and a second region ED-DA2. In FIG. 1, for example, the first region ED-DA1 may be present in the center and the second region ED-DA2 may be present at both sides. The present inventive concept is not limited thereto. In an embodiment, the display surface may be a bezel-less display surface without having a bezel region.

In FIG. 1, as an example of the image IM, icon images are illustrated.

As shown in FIG. 1, the image region ED-DA may have a quadrangular shape. The bezel region ED-NDA may surround the image region ED-DA. However, the embodiment of the inventive concept is not limited thereto. The shape of the image region ED-DA and the shape of the bezel region ED-NDA may have various shapes.

FIG. 2A to FIG. 2D are cross-sectional views of the electronic device ED according to an embodiment of the inventive concept. FIG. 2A to FIG. 2D illustrate cross-sections taken along the second direction axis DR2 and the third direction axis DR3. FIG. 2A to FIG. 2D describe the stacking relationship of functional panels and/or functional units constituting the electronic device ED.

The electronic device ED according to an embodiment of the inventive concept may include a display panel, an input sensor, an anti-reflection unit, and a window. At least some components among the display panel, the input sensor, the anti-reflection unit, and the window may be formed in a series of processes, or at least some components thereof may be bonded to each other through an adhesive member. In FIGS. 2A to 2D, an optical clear adhesive OCA is exemplarily illustrated as the adhesive member. The adhesive member described hereinafter may include a typical adhesive or a pressure-sensitive adhesive. In an embodiment of the inventive concept, the anti-reflection unit and the window may be replaced by other components, or may be omitted.

In FIGS. 2A to 2D, among the input sensor, the anti-reflection unit, and the window, a corresponding component formed in a series of processes with another component is represented as a "layer." Among the input sensor, the anti-reflection unit, and the window, a component bonded to another component though an adhesive member is represented as a "panel." The panel includes a base layer providing a base surface, such as a resin film, a composite film, a glass substrate, or the like, but the "layer," may not include the base layer. In other words, the units represented as "layers" are disposed on the base surface provided by other units.

Depending on the presence of a base layer, the input sensor, the anti-reflection unit, and the window may be referred to as an input sensing panel ISP, an anti-reflection panel RPP, and a window panel WP, or an input sensing layer ISL, an anti-reflection layer RPL, an a window layer WL.

Figure 2A:
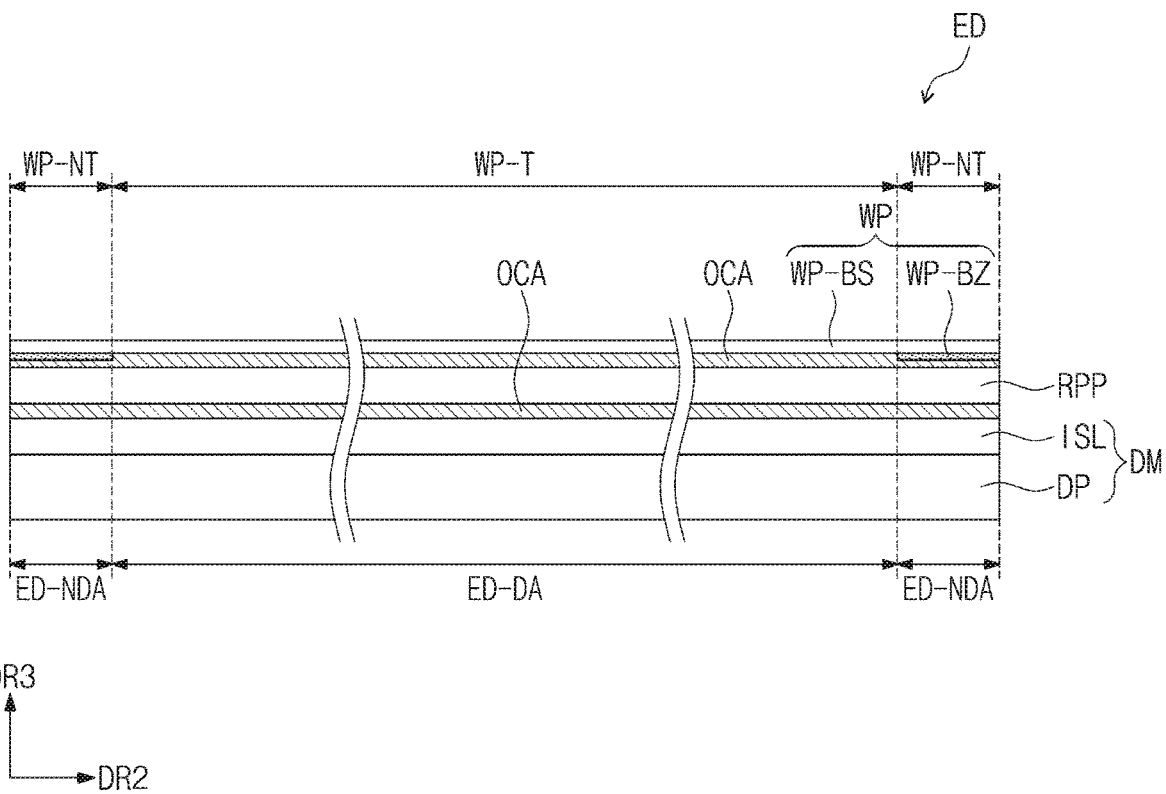
FIG. 2A to FIG. 2D are cross-sectional views of an electronic device according to an embodiment of the inventive concept.

As illustrated in FIG. 2A, the electronic device ED may include a display panel DP, an input sensing layer ISL, an anti-reflection panel RPP, and a window panel WP. The input sensing layer ISL is disposed directly on the display panel DP. In the present disclosure, "A component B is directly disposed on a component A" means that no separate adhesive layer/adhesive member is disposed between the component A and the component B. After the component A is formed, the component B may be integrally formed, through a series of processes, on a base surface provided by the component A.

A display module DM may include the display panel DP and the input sensing layer ISL. The input sensing layer ISL may be disposed directly on the display panel DP. Between the display module DM and the anti-reflection panel RPP and between the anti-reflection panel RPP and the window panel WP, the optical clear adhesive OCA is disposed. The present invention is not limited thereto. In an embodiment, the anti-reflection panel RPP may be integrally formed on the input sensing layer ISL. In an embodiment, the window panel WP may be integrally formed on the anti-reflection panel RPP.

The display panel DP may generate an image and the input sensing layer ISL may obtain the coordinate information of an external input (for example, a touch event). Although not separately illustrated, the display module DM according to an embodiment of the inventive concept may further include a protective member disposed on a lower surface of the display panel DP. The protective member and the display panel DP may be bonded to each other through an adhesive member. Each of the electronic devices ED of FIG. 2B to FIG. 2D to be described hereinafter may also further include a protective member. The present invention is not limited thereto. In an embodiment, the display panel DP may be integrally formed on the protective member.

The display panel DP according to an embodiment of the inventive concept may be a light emitting type display panel, but the present inventive concept is not limited thereto. In an embodiment, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum load, or the like. Hereinafter, for the convenience of description, the display panel DP will be described as an organic light emitting display panel.

The anti-reflection panel RPP may reduce the reflectance of external light incident from an upper side of the window panel WP. The anti-reflection panel RPP according to an embodiment of the inventive concept may include a phase retarder and a polarizer. The phase retarder may be a film type or a liquid crystal coating type, and may include a λ/2 phase retarder and/or a λ/4 phase retarder. The polarizer may also be of a film type or a liquid crystal coating type. The film type polarizer may include an extensible synthetic resin film, and the liquid crystal coating type polarizer may include liquid crystals arranged in a predetermined arrangement. The phase retarder and the polarizer each may further include a protective film. The phase retarder and the polarizer themselves or the protective film may be defined as a base layer of the anti-reflection panel RPP.

The anti-reflection panel RPP according to an embodiment of the inventive concept may include color filters. The color filters have a predetermined arrangement. The arrangement of the color filters may be determined in consideration of the light emitting colors of pixels included in the display panel DP. The anti-reflection panel RPP may further include a black matrix adjacent to the color filters.

The anti-reflection panel RPP according to an embodiment of the inventive concept may include a destructive interference structure. For example, the destructive interference structure may include a first reflective layer and a second reflective layer which are disposed on different layers. First reflective light and second reflective light respectively reflected from the first reflective layer and the second reflective layer may destructively interfere with each other, and accordingly, the reflectance of external light may be reduced.

The window panel WP according to an embodiment of the inventive concept may include a base layer WP-BS and a light blocking pattern WP-BZ. The base layer WP-BS may include a glass substrate and/or a synthetic resin film, and the like. The base layer WP-BS is not limited to a single layer. The base layer WP-BS may include two or more films bonded with an adhesive member.

The light blocking pattern WP-BZ partially overlaps the base layer WP-BS. For example, the light blocking pattern WP-BZ is disposed on the rear surface of the base layer WP-BS, and disposed in a light blocking region WP-NT of the base layer WP-BS. The light blocking region WP-NT may be disposed in the bezel region ED-NDA of the electronic device ED. The other region of the base layer WP-BS in which the light blocking pattern WP-BZ is not disposed is defined as a transmission region WP-T of the window panel WP. The transmission region WP-T may be disposed in the image region ED-DA.

Figure 2B:
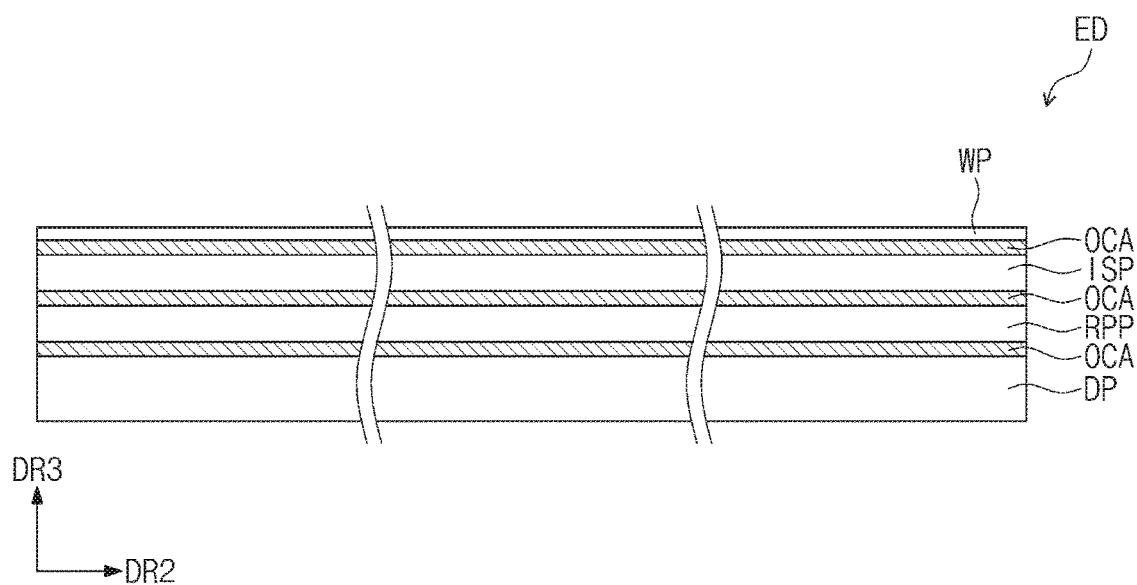
Figure 2C:
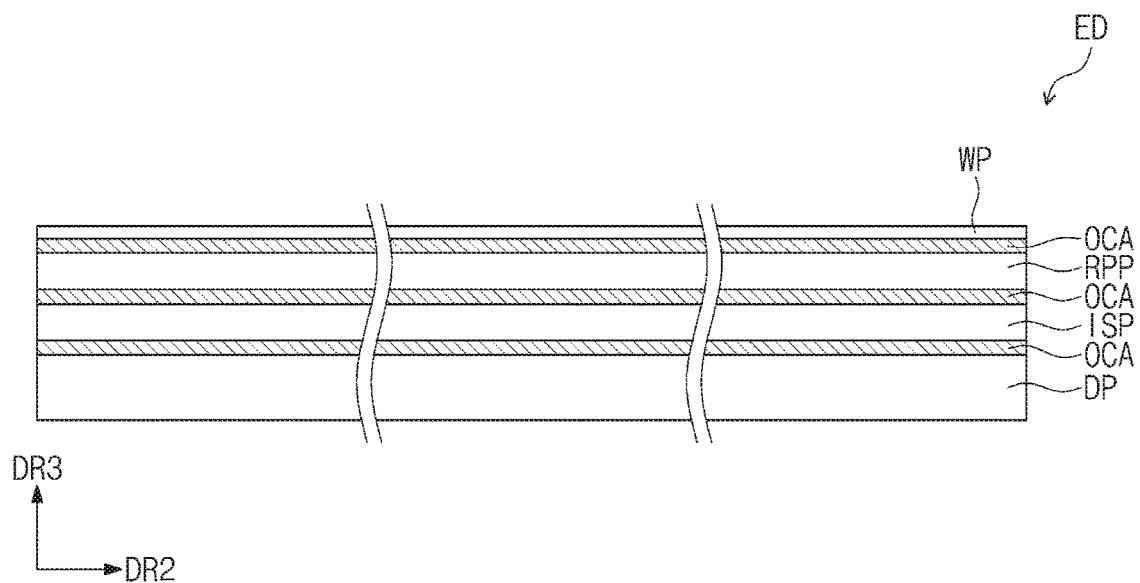
Figure 2D:
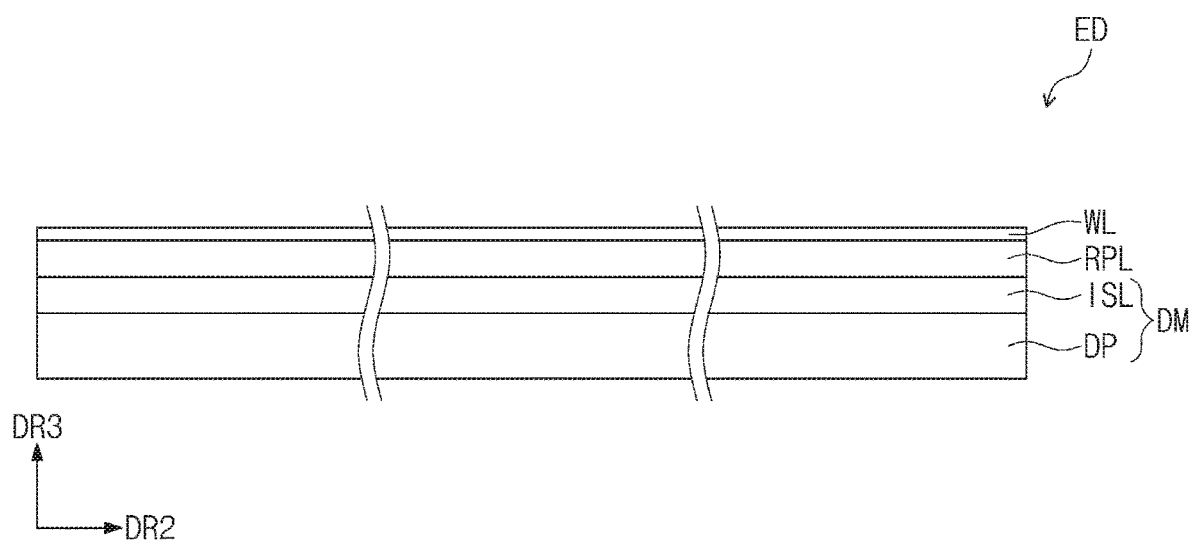

The light blocking pattern WP-BZ may be a colored organic film pattern, and for example, may be formed in a coating manner. Although not separately illustrated, the window panel WP may further include a functional coating layer disposed on the front surface of the base layer WP-BS. The functional coating layer may include an anti-fingerprint layer, an anti-reflection layer, a hard coating layer, and the like. In FIGS. 2B to 2D, the window panel WP and the window layer WL are illustrated without the representation of the base layer WP-BS and light blocking pattern WP-BZ.

As illustrated in FIG. 2B and FIG. 2C, the electronic device ED may include the display panel DP, the input sensing panel ISP, the anti-reflection panel RPP, and the window panel WP. The stacking order of the input sensing panel ISP and the anti-reflection panel RPP may be subject to change.

As illustrated in FIG. 2D, the electronic device ED may include the display panel DP, the input sensing layer ISL, the anti-reflection layer RPL, and the window layer WL. Adhesive members may be omitted from the electronic device ED, and on the base surface provided in the display panel DP, the input sensing layer ISL, the anti-reflection layer RPL, and the window layer WL may be integrally formed in a series of processes. The stacking order of the input sensing layer ISL and the anti-reflection layer RPL may be subject to change.

Figure 3A:
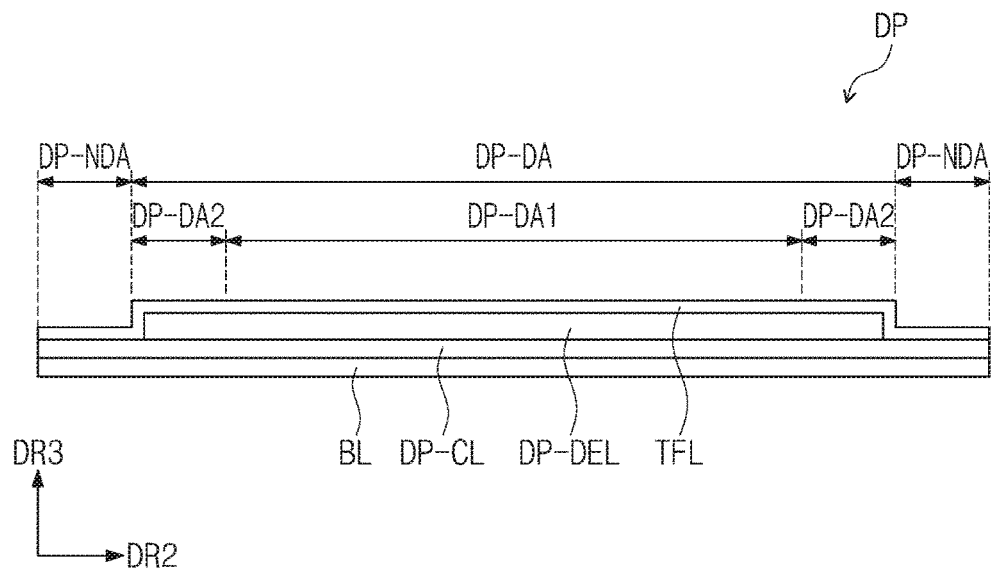
FIG. 3A and FIG. 3B are cross-sectional views of a display panel according to an embodiment of the inventive concept.
Figure 3B:
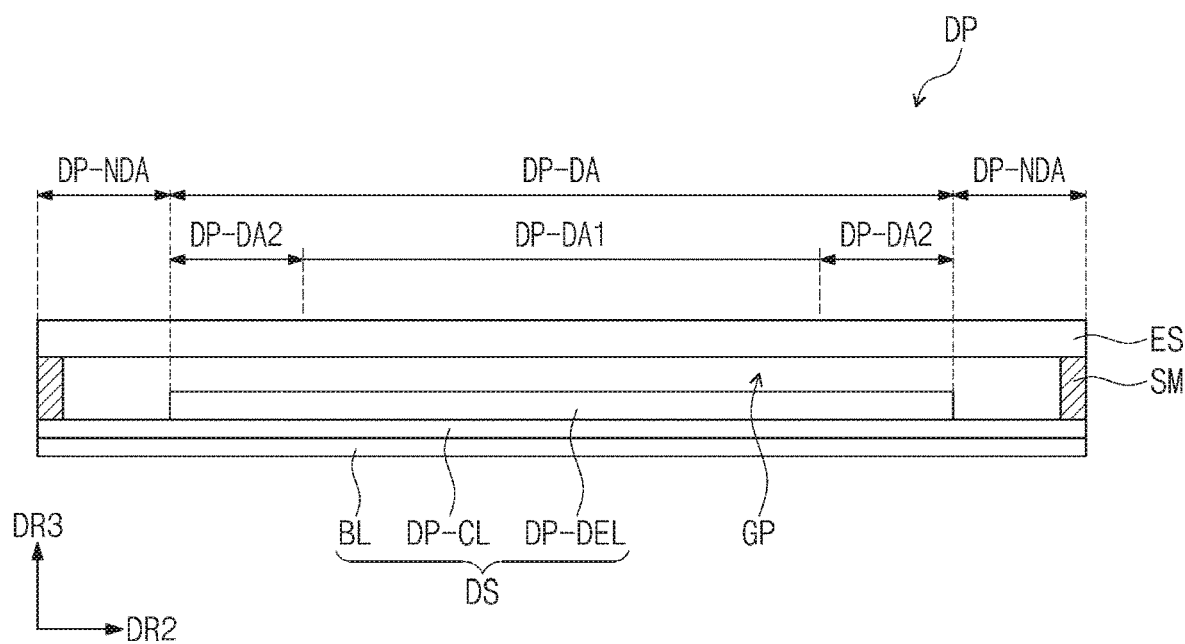

FIG. 3A and FIG. 3B are cross-sectional views of the display panel DP according to an embodiment of the inventive concept.

As illustrated in FIG. 3A, the display panel DP includes a base layer BL, a circuit element layer DP-CL disposed on the base layer BL, a display element layer DP-DEL, and an upper insulation layer TFL. A display region DP-DA and a non-display region DP-NDA corresponding to the image region ED-DA and the bezel region ED-NDA illustrated in FIG. 1 may be defined in the display panel DP. In addition, the first region ED-DA1 and the second region ED-DA2 illustrated in FIG. 1 may respectively correspond to a first region DP-DA1 and a second region DP-DA2 defined in the display panel DP. In the present embodiment, when a region corresponds to another region, it means that the regions overlap each other, and the regions are not limited to having the same area.

The base layer BL may include at least one plastic film. The base layer BL may include a plastic substrate, a glass substrate, a metal substrate, or an organic/inorganic composite material substrate.

The circuit element layer DP-CL includes at least one intermediate insulation layer and a circuit element. The intermediate insulation layer may include at least one intermediate inorganic film and at least one intermediate organic film. The circuit element may include signal lines, a driving circuit of a pixel, and the like. A detailed description thereof will be followed.

The display element layer DP-DEL may include at least organic light emitting diodes. The display element layer DP-DEL may include an organic film such as a pixel definition film.

The upper insulation layer TFL may include a plurality of thin films. Some thin films of the upper insulating layer TFL may increase optical efficiency, and some thin films thereof may serve to protect organic light emitting diodes. A detailed description of the upper insulation layer TFL will be followed.

As illustrated in FIG. 3B, the display panel DP includes the base layer BL, the circuit element layer DP-CL disposed on the base layer BL, the display element layer DP-DEL, an encapsulation substrate ES and a sealant SM for bonding the base layer BL and the encapsulation substrate ES. The encapsulation substrate ES may be spaced apart from the display element layer DP-DEL having a predetermined gap GP therebetween. The base layer BL and the encapsulation substrate ES may include a plastic substrate, a glass substrate, a metal substrate, or an organic/inorganic composite material substrate. The sealant SM may include an organic adhesive member or frit, and the like.

Figure 4:
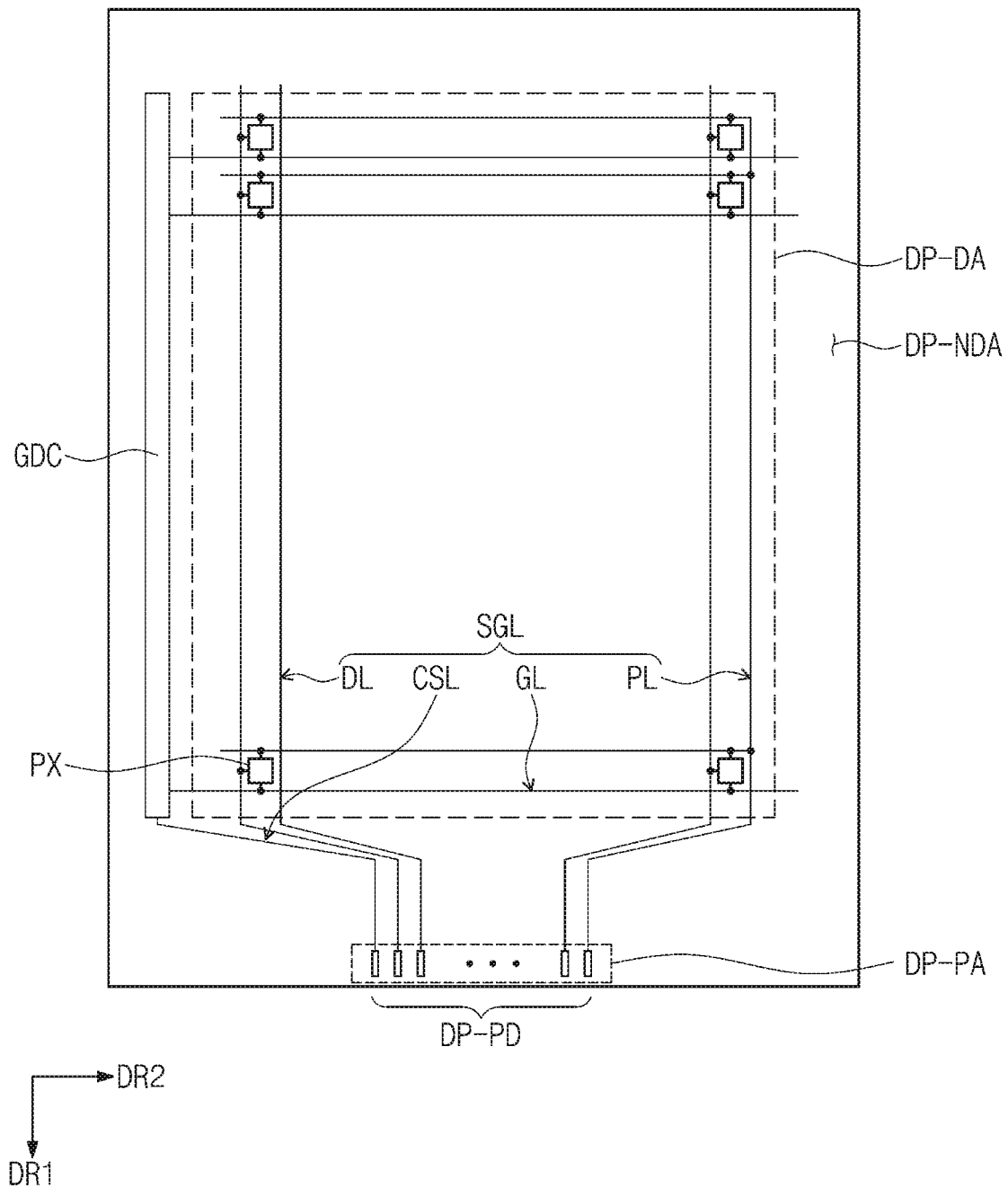
FIG. 4 is a plan view of a display panel according to an embodiment of the inventive concept.
Figure 5A:
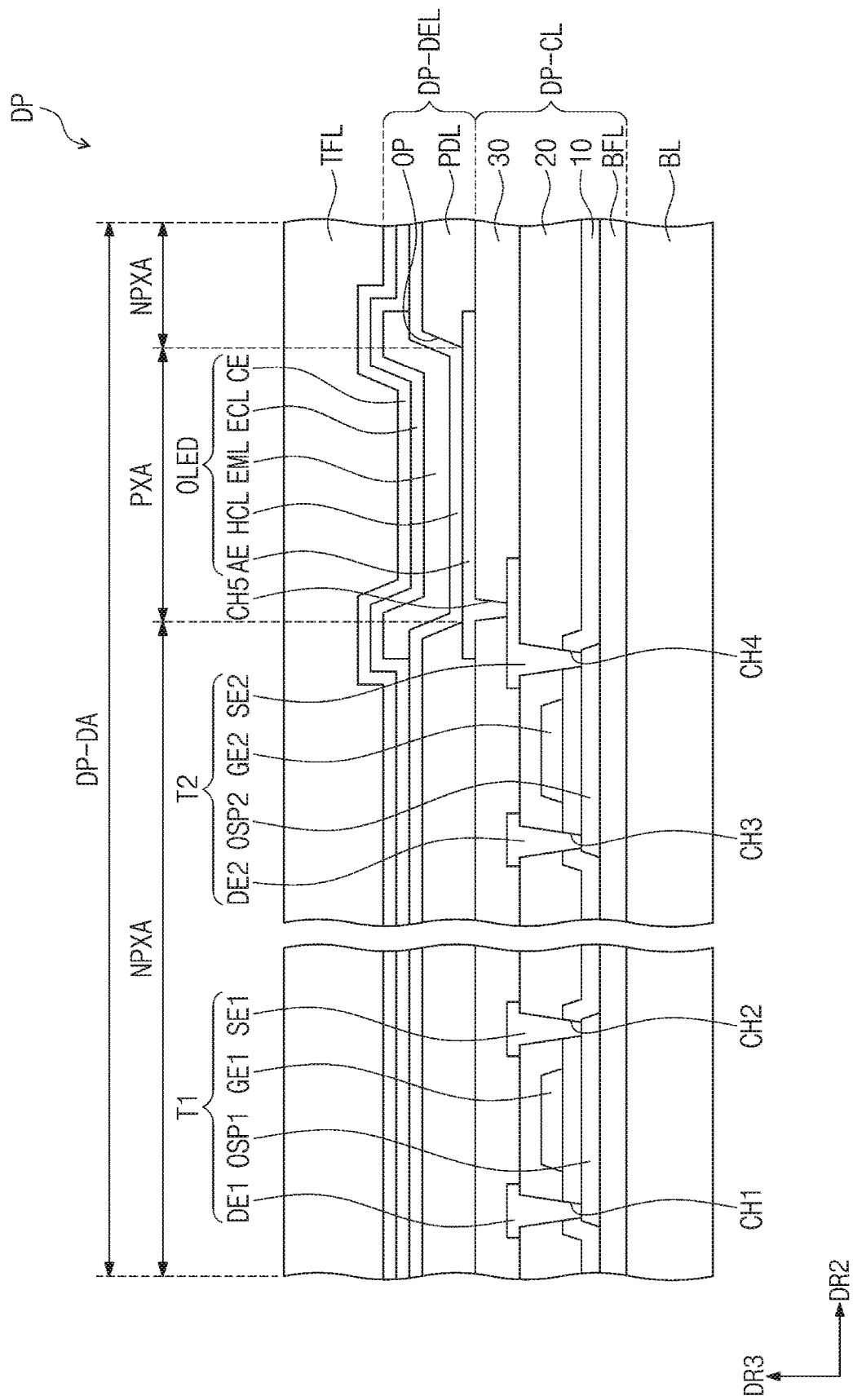
FIG. 5A is an enlarged cross-sectional view of a display panel according to an embodiment of the inventive concept.

FIG. 4 is a plan view of the display panel DP according to an embodiment of the inventive concept. FIG. 5A is an enlarged cross-sectional view of the display panel DP according to an embodiment of the inventive concept. FIG.

5B is an enlarged cross-sectional view of the upper insulation layer TFL according to an embodiment of the inventive concept. The display panel DP of FIG. 5A is illustrated based on the display panel DP of FIG. 3A.

As illustrated in FIG. 4, the display panel DP includes a driving circuit GDC, a plurality of signal lines SGL (hereinafter, signal lines), a plurality of signal pads DP-PD (hereinafter, signal pads), and a plurality of pixels PX (hereinafter, pixels).

The display region DP-DA may be defined as a region in which the pixels PX are disposed. Each of the pixels PX includes an organic light emitting diode and a pixel driving circuit connected thereto. The driving circuit GDC, the signal lines SGL, the signal pads DP-PD, and the pixel driving circuit may be included in the circuit element layer DP-CL illustrated in FIG. 3A and FIG. 3B.

The driving circuit GDC may include a scan driving circuit. The scan driving circuit may generate a plurality of scan signals (hereinafter, scan signals), and sequentially output the scan signals to a plurality of scan lines GL (hereinafter, scan lines) to be described later. The scan driving circuit may further output another control signal to a driving circuit of the pixels PX.

The scan driving circuit may include a plurality of thin film transistors formed through the same process of the driving circuit of the pixels PX, for example, a Low Temperature Polycrystalline Silicon (LTPS) process or a Low Temperature Polycrystalline Oxide (LTPO) process.

The signal lines SGL include the scan lines GL, data lines DL, a power line PL, and a control signal line CSL. Each of the scan lines GL is connected to a corresponding pixel PX among the plurality of pixels PX, and each of the data lines DL is connected to a corresponding pixel PX among the plurality of pixels PX. The power line PL is connected to the pixels PX. The control signal line CSL may provide control signals to the scan driving circuit.

The signal lines SGL overlap the display region DP-DA and the non-display region DP-NDA. The signal lines SGL may include a pad part and a line part. The line part may overlap the display region DP-DA and the non-display region DP-NDA. The pad part may be connected to an end of the line part. The pad part may be disposed in the non-display region DP-NDA and overlap a corresponding signal pad among signal pads DP-PD. A region of the non-display region DP-NDA in which the signal pads DP-PD are disposed may be defined as a pad region DP-PA. A circuit substrate (not shown) may be connected to the pad region DP-PA.

The line part connected to the pixel PX may constitute most of the signal line SGL. The line part may be connected to transistors T1 and T2 (see FIG. 5A) of the pixel PX. The line part may have a single-layered/multi-layered structure, and the line part may be a single body, or may include two or more other parts. The two or more parts may be disposed on different layers, and may be connected to each other through a contact hole passing through an insulation layer disposed between the two or more line parts.

FIG. 5A illustrates a partial cross-section of the display panel DP, which shows the transistors T1 and T2 and a light emitting diode OLED formed in the display panel DP. The circuit element layer DP-CL disposed on the base layer BL may include at least one insulation layer and a circuit element. The circuit element may include a signal line, a driving circuit of a pixel, and the like. The circuit element layer DP-CL may be formed through a forming process of an insulation layer, a semiconductor layer, and a conductive layer by coating, deposition, and the like, and a patterning process of the insulation layer, the semiconductor layer, and the conductive layer by a photolithography process.

In an embodiment, the circuit element layer DP-CL may include a buffer film BFL which is an inorganic film, a first intermediate inorganic film 10, a second intermediate inorganic film 20, and an intermediate organic film 30. The buffer film BFL may include a plurality of inorganic films laminated. FIG. 5A exemplarily illustrates the arrangement relationship of a first semiconductor pattern OSP1, a second semiconductor pattern OSP2, a first control electrode GE1, a second control electrode GE2, a first input electrode DE1, a first output electrode SE1, a second input electrode DE2, a second output electrode SE2 all constituting a switching transistor T1 and a driving transistor T2. First to fourth through-hole CH1 to CH4 are also exemplarily shown.

The display element layer DP-DEL may include the organic light emitting diode OLED. The display element layer DP-DEL includes a pixel definition film PDL. For example, the pixel definition film PDL may be an organic layer.

On the intermediate organic film 30, a first electrode AE is disposed. The first electrode AE is connected to a second output electrode SE2 through a third through-hole CH5 passing through the intermediate organic film 30. On the pixel definition film PDL, an opening OP is defined. The opening OP of the pixel definition film PDL exposes at least a portion of the first electrode AE. The opening OP of the pixel definition film PDL is referred to as a light emitting opening to identify the same from the other openings.

As illustrated in FIG. 5A, the display region DP-DA includes a light emitting region PXA, and a non-light emitting region NPXA adjacent to the light emitting region PXA. The non-light emitting region NPXA may surround the light emitting region PXA. In an embodiment, the light emitting region PXA is defined to correspond to some regions of the first electrode AE exposed by the opening OP.

A hole control layer HCL may be commonly disposed in the light emitting region PXA and the non-light emitting region NPXA. The hole control layer HCL may include a hole transport layer, and may further include a hole injection layer. On the hole control layer HCL, an emission layer EML is disposed. The emission layer EML is disposed in a region corresponding to the opening OP. For example, the emission layer EML may be divided and formed in each of the plurality of pixels PX. The emission layer EML may include an organic material and/or an inorganic material. The emission layer EML may generate a predetermined colored light.

On the emission layer EML, an electron control layer ECL is disposed. The electron control layer ECL may include an electron transport layer, and may further include an electron injection layer. The hole control layer HCL and the electron control layer ECL may be commonly formed in the plurality of pixels PX using an open mask. On the electron control layer ECL, the second electrode CE is disposed. The second electrode CE has an integral shape and is commonly disposed in a plurality of pixels.

Figure 5B:
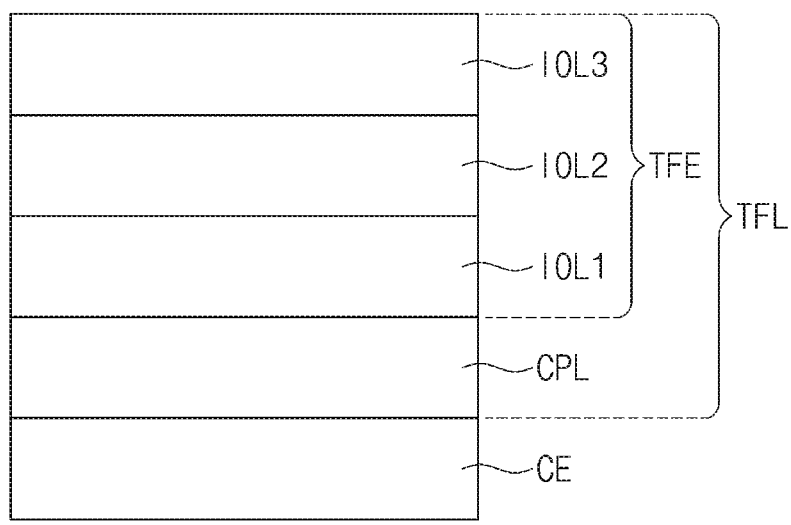
FIG. 5B is an enlarged cross-sectional view of an upper insulation layer according to an embodiment of the inventive concept.

As illustrated in FIG. 5A and FIG. 5B, on the second electrode CE, the upper insulation layer TFL is disposed. The upper insulation layer TFL may include a plurality of thin films. In an embodiment, the upper insulation layer TFL includes a capping layer CPL and a thin film encapsulation layer TFE. The thin film encapsulation layer TFE includes a first inorganic thin film IOL1, a first organic thin film IOL2, and a second inorganic thin film IOL3.

The capping layer CPL is disposed on the second electrode CE and contacts the second electrode CE. The capping layer CPL may include an organic material. The first inorganic layer IOL1 is disposed on the capping layer CPL and contacts the capping layer CPL. The organic layer IOL2 is disposed on the first inorganic layer IOL1 and contacts the first inorganic layer IOL1. The second inorganic layer IOL3 is disposed on the organic layer IOL2 and contacts the organic layer IOL2.

The capping layer CPL may serve to protect the second electrode CE from a subsequent process, such as a sputtering process, and increase the light emitting efficiency of the organic light emitting diode OLED. The capping layer CPL may have a greater refractive index than the first inorganic layer TOLL The first inorganic layer IOL1 and the second inorganic layer IOL3 may serve to protect the display element layer DP-DEL from moisture/oxygen, and the organic layer IOL2 may serve to protect the display element layer DP-DEL from foreign materials such as dust particles. The first inorganic layer IOL1 and the second inorganic layer IOL3 may be any one among a silicon nitride layer, a silicon oxynitride layer, and a silicon oxide layer. In an embodiment, the first inorganic layer IOL1 and the second inorganic layer IOL3 may include a titanium oxide layer, an aluminum oxide layer, or the like. The organic layer IOL2 may include an acrylic organic layer, but the present inventive concept is not limited thereto.

In an embodiment of the inventive concept, between the capping layer CPL and the first inorganic layer IOL1, an inorganic layer, for example, an LiF layer may be further disposed. The LiF layer may increase the light emitting efficiency of the light emitting element OLED.

Figure 6A:
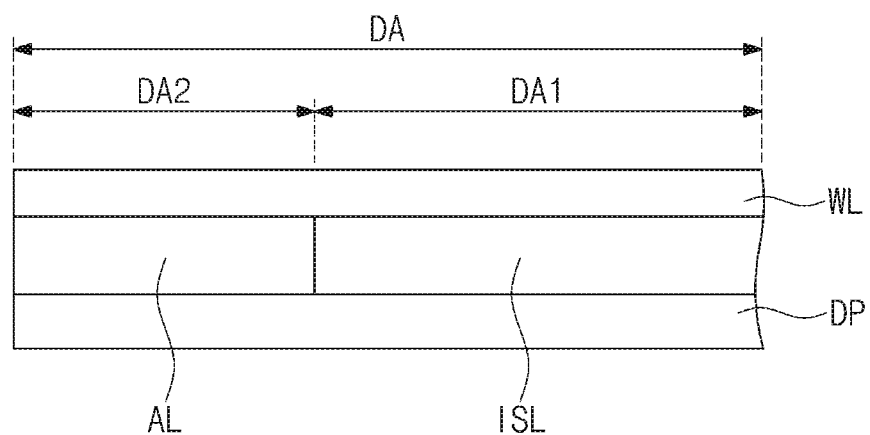
FIG. 6A is a cross-sectional view of an electronic device according to an embodiment of the inventive concept.
Figure 6B:
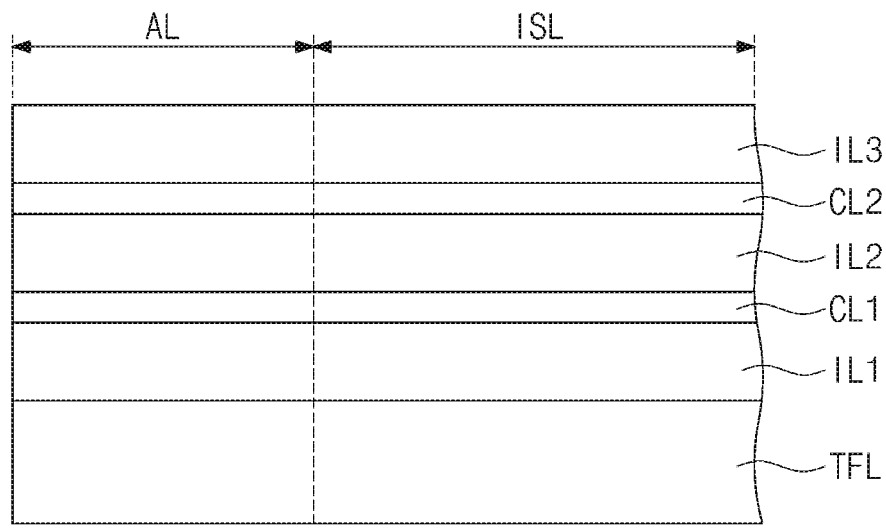
FIG. 6B is a cross-sectional view of an input sensor and an antenna according to an embodiment of the inventive concept.

FIG. 6A is a cross-sectional view of an electronic device according to an embodiment of the inventive concept. FIG. 6B is a cross-sectional view of an input sensor and an antenna according to an embodiment of the inventive concept. For the convenience of description, a window WL, an input sensor ISL, and an antenna AL of a "layer" type are exemplarily illustrated.

In FIG. 6A, the electronic device ED includes a display panel DP, an antenna AL, an input sensor ISL, and a window WL. In an embodiment, the electronic device ED includes the window WL on the display panel DP, and between the display panel DP and the window WL, the antenna AL and the input sensor ISL may be disposed. Duplicate descriptions of the display panel DP, the window, and the input sensor will be omitted. Here, the antenna AL may transmit, receive, or transmit/receive a wireless communication signal, for example a radio frequency signal. The antenna AL may include a plurality of antenna elements, and the plurality of antenna elements may transmit, receive, or transmit/receive the same frequency band, or transmit, receive, or transmit/receive different frequency bands.

The antenna AL may be provided to a display region DA. In an embodiment, the antenna AL may be disposed in a region of a display region in which the input sensor ISL is not disposed. For example, the input sensor ISL may be disposed in a first region DA1 of a display region, and the antenna AL may be disposed in a second region DA2 of the display region. The antenna AL and the input sensor ISL may be disposed on the same layer. The antenna AL may be generated by being stacked together in the stacking process of the input sensor ISL. In an embodiment, the antenna AL may be disposed on an upper side of the display panel DP and spaced apart from the display panel DP by 150 μm to 200 μm in the thickness direction. For example, between the antenna AL and the display panel DP, an insulation layer of 150 μm to 200 μm may be disposed. This is to reduce signal interference.

In FIG. 6B, the input sensor ISL and the antenna AL each may include a first insulation layer IL1, a first conductive layer CL1, a second insulation layer IL2, a second conductive layer CL2, and a third insulation layer IL3. The first insulation layer IL1 is disposed directly on the upper insulation layer TFL. In an embodiment of the inventive concept, the first insulation layer IL1 may be omitted.

Each of the first conductive layer CL1 and the second conductive layer CL2 may have a single-layered structure, or a multi-layered structure in which layers are laminated along the third direction axis DR3. A conductive layer of a multi-layered structure may include at least one transparent conductive layer and at least one metal layer. The transparent conductive layer may include indium tin oxide (ITO), indium zinc oxide (IZO), zinc oxide (ZnO), indium tin zinc oxide (ITZO), PEDOT, metal nanowires, and graphene. The metal layer may include molybdenum, silver, titanium, copper, aluminum, or an alloy thereof. For example, each of the first conductive layer CL1 and the second conductive layer CL2 may have a three-layered metal layer structure, such as titanium/aluminum/titanium.

Each of the first insulation layer IL1 to the third insulation layer IL3 may include an inorganic material or an organic material. In an embodiment, each of the first insulation layer IL1 and the second insulation layer IL2 may be an inorganic film including an inorganic matter. The inorganic film may include at least one of aluminum oxide, titanium oxide, silicon oxide, silicon oxynitride, zirconium oxide, and hafnium oxide. The third insulation layer IL3 may include an organic film. The organic film may include at least any one among an acrylic resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin. A more detailed description of the input sensor ISL and the antenna is described with reference to FIG. 8 and FIG. 9, respectively.

Figure 7:
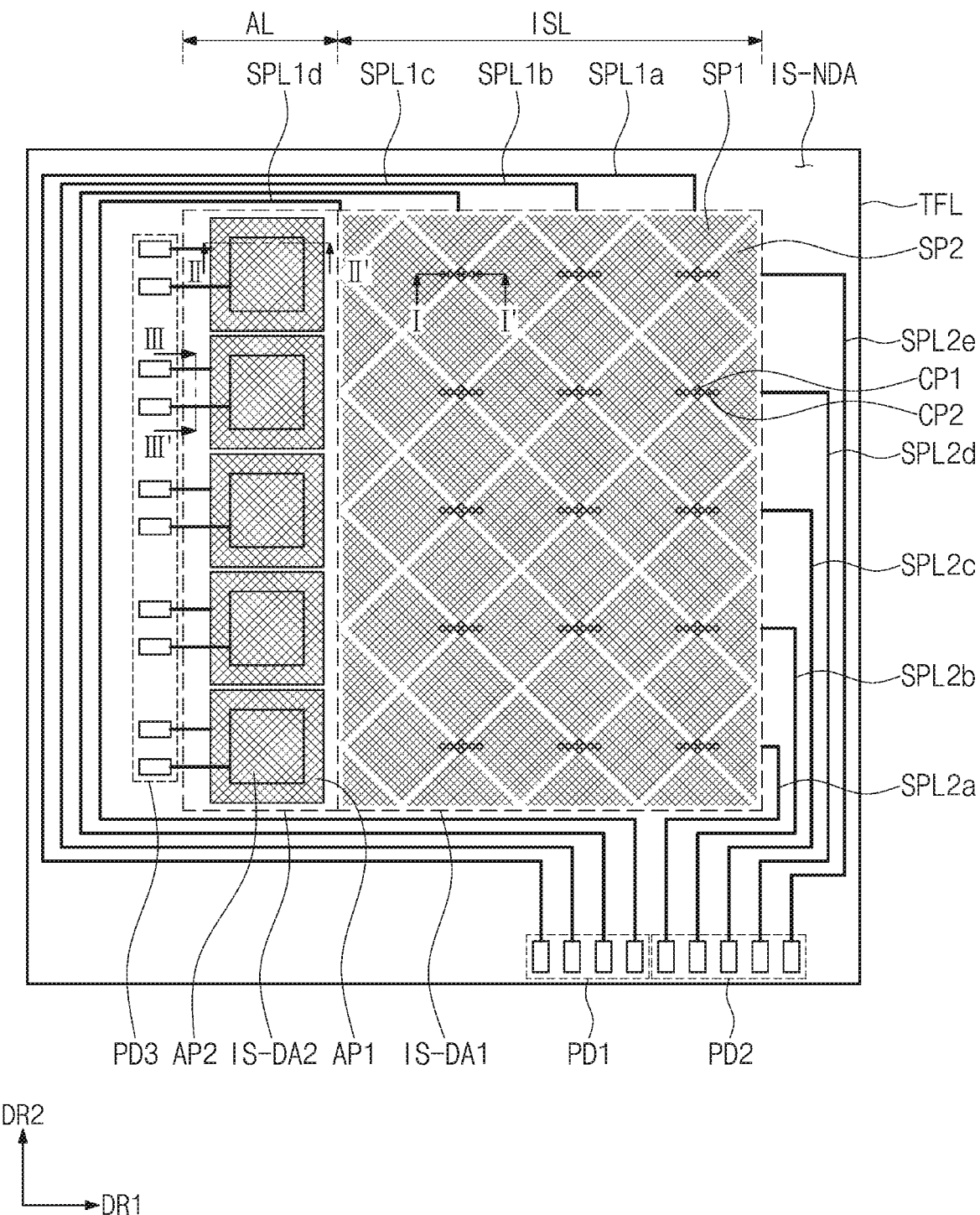
FIG. 7 is a plan view of an input sensor and an antenna according to an embodiment of the inventive concept.

FIG. 7 is a plan view of an input sensor and an antenna according to an embodiment of the inventive concept.

As illustrated in FIG. 7, the input sensor ISL includes a sensing region IS-DA1 and a wiring region IS-NDA respectively corresponding to (or overlapping) the first region DP-DA1 (see FIG. 3A) and the non-display region DP-NDA of the display region of the display panel DP. The antenna AL may include an antenna region IS-DA2 corresponding to (or overlapping) the second region DP-DA2 (see FIG. 3) of the display region.

The input sensor ISL includes a plurality of first sensor units (e.g., first sensor electrodes) SP1, a plurality of second sensor units (i.e., second sensor electrodes) SP2, a plurality of first connecting units (i.e., first connecting electrodes) CP1, a plurality of second connecting units (i.e., second connecting electrodes) CP2, a plurality of sensing signal lines, a first pad unit PD1, and a second pad unit PD2. The antenna AL includes a plurality of first antenna elements AP1, a plurality of second antenna elements AP2, a third pad unit PD3, and a plurality of transmission lines.

The first sensor units SP1 and the second sensor units SP2 are disposed in the sensing region IS-DAL The first antenna elements AP1 and the second antenna elements AP2 are disposed in the antenna region IS-DA2. The plurality of sensing signal lines, the plurality of transmission lines, the first pad unit PD1, the second pad unit PD2, and the third pad unit PD3 are disposed in the wiring region IS-NDA.

The first sensor units SP1 are arranged in the first direction DR1 and in the second direction DR2. Each of the first sensor units SP1 and the first connecting units CP1 may have a mesh pattern having a plurality of mesh openings. Each of the first sensor units SP1 and each of the first connecting units CP1 are alternately arranged in the second direction DR2. Each of the first connecting units CP1 connects two first sensor units SP1 adjacent to each other among the first sensor units SP1.

The second sensor units SP2 are arranged in the first direction DR1 and in the second direction DR2. Each of the second sensor units SP2 and the second connecting units CP2 may have a mesh pattern having a plurality of mesh openings. Each of the second sensor units SP2 and each of the second connecting units CP2 are alternately arranged in the first direction DR1. Each of the second connecting units CP2 connects two second sensor units SP2 adjacent to each other among the second sensor units SP2.

The first sensor units SP1 and the second sensor units SP2 may be electrostatically coupled. As sensing signals are applied to the first sensor units SP1, capacitors are formed between the first sensor units SP1 and the second sensor units SP2.

Referring to FIG. 6B, the second connecting units CP2 according to an embodiment of the inventive concept may be included in the first conductive layer CL1 (see FIG. 6B) and may connect the second sensor units SP2 described with reference to FIG. 7. The first sensor units SP1, the second sensor units SP2, and the first connecting units CP1 are included in the second conductive layer CL2 (see FIG. 6B) and the second connecting units CP2 may connect the second sensor units SP2 described with reference to FIG. 7. However, the inventive concept is not limited thereto. The positions of the first conductive layer CL1 and the second conductive layer CL2 may be subject to change.

The plurality of sensing signal lines include first sensing signal lines SPL1a to SPL1d and second sensing signal lines SPL2a to SPL2e. One ends of the first sensing signal lines SPL1a to SPL1d are connected to the first sensor units SP1, and the other ends of the first sensing signal lines SPL1a to SPL1d are respectively connected to pads included in the first pad unit PD1. The first sensing signal lines SPL1a to SPL1d may transmit sensing signals which have been output from the first pad unit PD1 to the first sensor units SP1.

One ends of the second sensing signal lines SPL2a to SPL2e are connected to the second sensor units SP2. The other ends of the second sensing signal lines SPL2a to SPL2e are respectively connected to pads included in the second pad unit PD2. The second sensing signal lines SPL2a to SPL2e transmit electrical signals which have been output from the second pad unit PD2 to the second sensor units SP2.

Although not illustrated, the first sensing signal lines SPL1a to SPL1d and the second sensing signal lines SPL2a to SPL2e may also be provided as a mesh pattern.

The first antenna elements AP1 and the second antenna elements AP2 may be arranged in the second direction DR2. For the convenience of description, four first antenna elements AP1 and four second antenna elements AP2 are arranged in the second direction DR2. Each of the four second antenna elements AP2 overlap a corresponding one of the four first antenna elements AP1. The present inventive concept, however, is not limited thereto. The number of the first antenna elements AP1 and the number of the second antenna elements AP2 are not limited to FIG. 7, and may be less or greater than 4. In FIG. 7, an antenna is disposed only in the second region DA2 in one direction of the display region. However, the inventive concept is not limited thereto. The antenna may be disposed in each of the second regions ED-DA2 (see FIG. 1) present on the left and right side of the first region ED-DA1 The first and second antenna elements AP1 and AP2 may have a mesh pattern. To allow an image provided in the display region DA-DA to be transmitted, each of the first and second antenna elements AP1 and AP2 may have a mesh pattern. The mesh pattern may mean a structure in which a plurality of openings are defined in a predetermined layer. Alternatively, the mesh pattern may be referred to as a lattice structure. The first and second antenna elements AP1 and AP2 may be modified in various shapes in the antenna region IS-DA2. In an embodiment, the second antenna elements AP2 may be disposed on a different layer from the first antenna elements AP1. The second antenna elements AP2 may be disposed on an upper side of the first antenna elements AP1, and each of the second antenna elements AP2 may overlap a corresponding one of the first antenna elements AP1. The first antenna elements AP1 and the second antenna elements AP2 may have frequency bands different from each other. In an embodiment, the first antenna elements AP1 may have a first frequency band over which the first antenna elements AP1 may operate correctly, and the second antenna elements AP2 may have a second frequency band over which the second antenna elements AP2 may operate correctly. In an embodiment, the second frequency band may be greater than the first frequency band. For example, the first frequency band is a frequency range from 26 GHz to 30 GHz or from 27 GHz to 29 GHz. The first antenna elements AP1 may operate at 28 GHz. For example, the second frequency band is a frequency range from 36 GHz to 39 GHz or from 38 GHz to 40 GHz. The second antenna elements AP2 may operate at 39 GHz.

On a plane, the area of the second antenna element AP2 is smaller than the area of the first antenna element AP1. An antenna element may have an area which is inversely proportional to a frequency within a frequency band over which the antenna element operates correctly, so that the area of the first antenna element AP1 providing the first frequency band is greater than the area of the second antenna element AP2 providing the second frequency band. A frequency within the second frequency band is higher than a frequency within the first frequency band.

The plurality of transmission lines may connect the first antenna elements AP1 and the second antenna elements AP2, and may transmit a signal of a frequency within a frequency band provided to the third pad unit PD3. The third pad unit PD3 may be connected to a circuit unit (not shown) such as a radio frequency integrated circuit and provide a signal.

Figure 8:
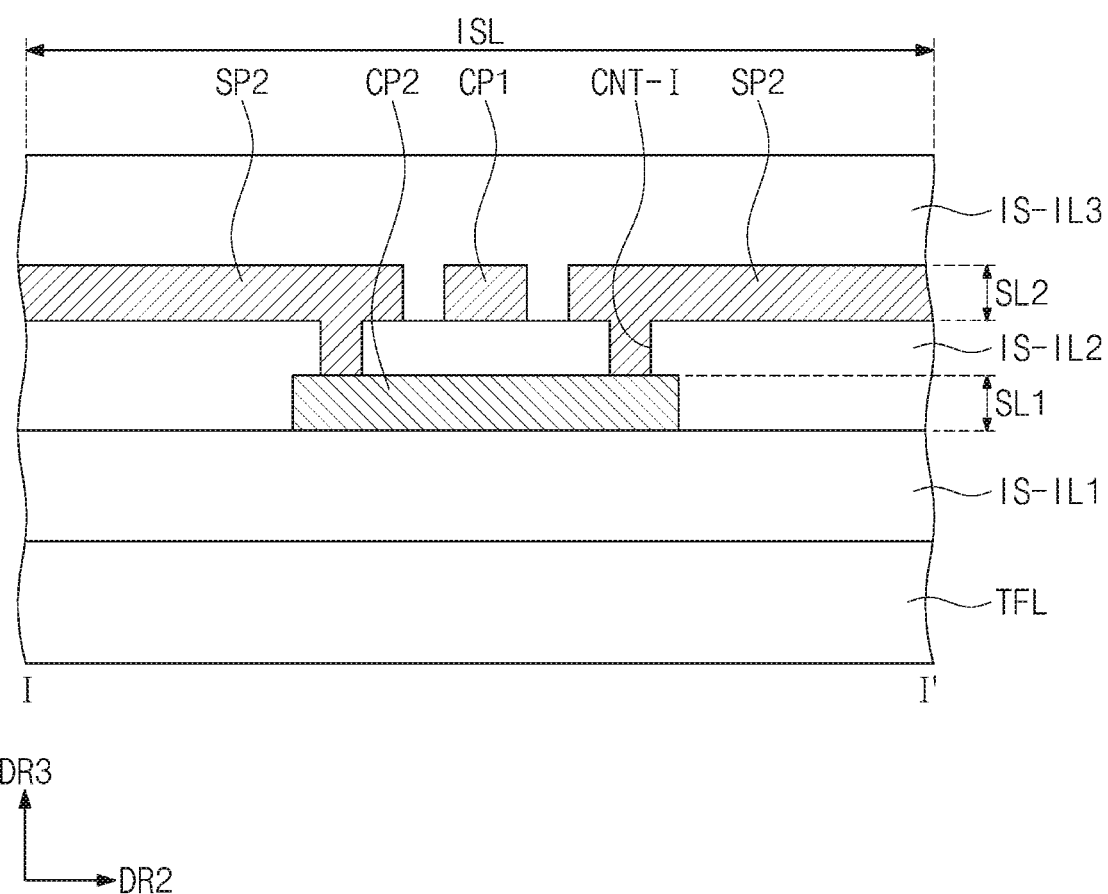
FIG. 8 is a cross-sectional view of an input sensor according to an embodiment of the inventive concept.

FIG. 8 is a cross-sectional view of an input sensor according to an embodiment of the inventive concept. FIG. 8 is a cross-sectional view of a surface taken along line I-I' of FIG. 7.

Referring to FIG. 8, an input sensor includes a first sensing layer SL1 and a second sensing layer SL2.

In the present embodiment, the first sensing layer SL1 includes a plurality of second connecting units CP2. The plurality of second connecting units CP2 are formed from the first conductive layer CL1 (see FIG. 6B). The second sensing layer SL2 includes a plurality of first sensor units SP1, a plurality of second sensor units SP2 (see FIG. 7) and a plurality of first connecting units CP1. The plurality of first sensor units SP1, the plurality of second sensor units SP2 (see FIG. 7) and the plurality of first connecting units CP1 are formed from the second conductive layer CL2 (see FIG.

6B). The second sensor units SP2 and the second connecting units CP2 may be connected through first connecting contact holes CNT-1 passing through a second insulation layer IS-IL2. The second connecting units CP2 are disposed on a first insulation layer IS-IL1 and may be covered by the second insulation layer IS-IL2, and the first sensor units SP1, the second sensor units SP2 (see FIG. 7), and the first connecting units CP1 are disposed on the second insulation layer IS-IL2 and may be covered by a third insulation layer IS-IL3. In an embodiment, each of the second connecting units CP2 may include a bridge pattern, below a corresponding first connecting unit CP1, connecting two adjacent second sensor units SP2 which are disposed higher than the bridge pattern. For example, a plurality of first connecting units CP1 and a plurality of second connecting units CP2 are illustrated as intersecting each other. However, the inventive concept is not limited thereto. In an embodiment, each of the second connecting units CP2 may be modified into the shape of "<" and/or ">" so as not to overlap the first connecting units CP1. The second connecting units CP2 in the shape of "<" or ">" may overlap the first sensor units SP1.

Figure 9:
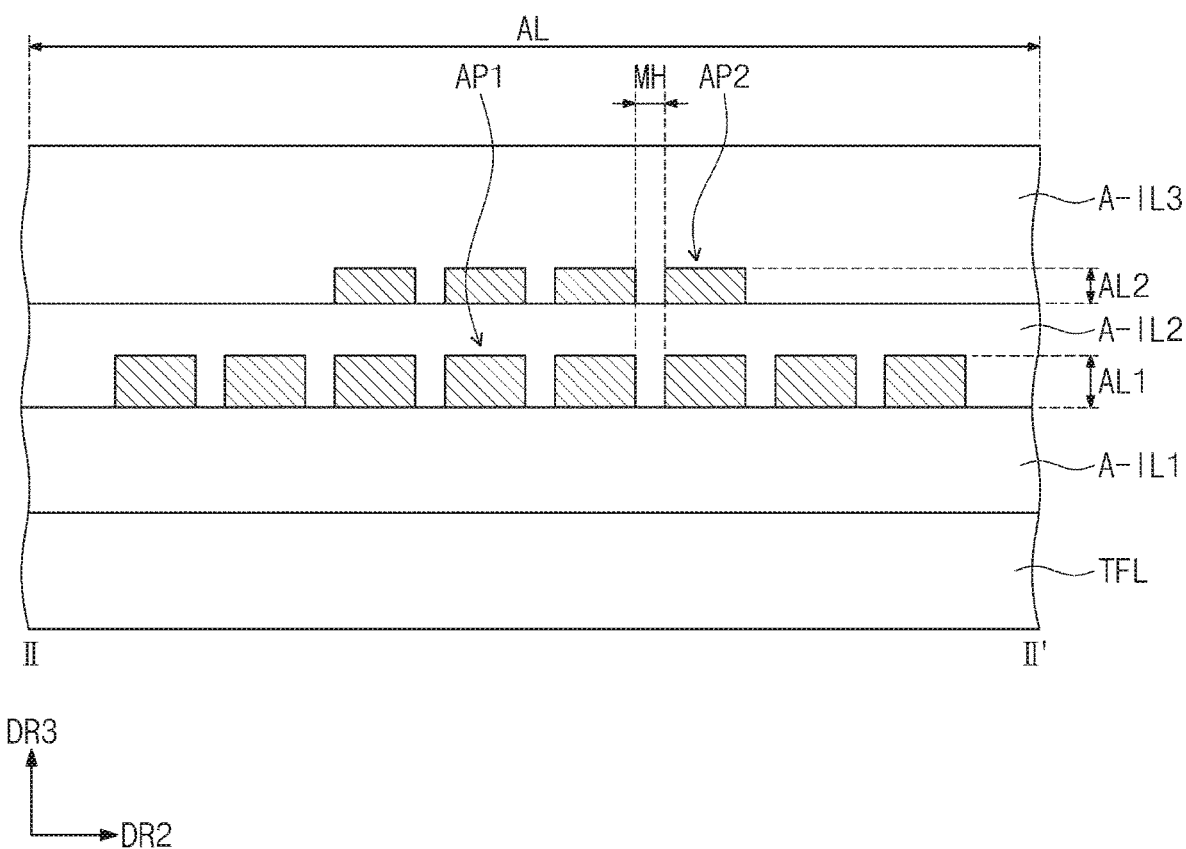
FIG. 9 is a cross-sectional view of an antenna according to an embodiment of the inventive concept.

FIG. 9 is a cross-sectional view of an antenna according to an embodiment of the inventive concept. FIG. 9 is a cross-sectional view of a surface taken along line II-IF of FIG. 7.

Referring to FIG. 9, an antenna includes a first antenna layer AL1 and a second antenna layer AL2. The first antenna layer AL1 includes a plurality of first antenna elements AP1 and the second antenna layer AL2 includes a plurality of second antenna elements AP2. The first antenna layer AL1 and the second antenna layer AL2 are respectively provided to the same layer as the first sensing layer SL1 and the second sensing layer SL2 in FIG. 8. The antenna AL may have the same stacking structure as the input sensor ISL. In an exemplary, the first antenna layer AL1 and the first sensing layer SL1 may be formed from the same layer, and the second antenna layer AL2 and the second sensing layer SL2 may be formed from the same layer. For example, the first antenna layer AL1 and the first sensing layer SL1 may be formed from the first conductive layer CL1, and the second antenna layer AL2 and the second sensing layer SL2 may be formed from the second conductive layer CL2. Referring to FIG. 9, the first antenna elements AP1 and the second connecting units CP2 may be formed from the first conductive layer CL1. The second antenna elements AP2, the first and second sensor units SP1 and SP2, and the first connecting units CP1 may be formed from the second conductive layer CL2. The first antenna layer AL1 and the second connecting units CP2 are disposed on a first insulation layer A-IL1 and covered by a second insulation layer A-IL2. The second antenna layer AL2, the first and second sensor units SP1 and SP2, and the first connecting units CP1 are disposed on the second insulation layer A-IL2, and may be covered by a third insulation layer A-IL3. The first to third insulation layers of the antenna AL correspond to the same layer as the first to third insulation layers of the input sensor ISL. In an embodiment, on the first antenna layer AL1, the first antenna element AP1 may be disposed, and on the second antenna layer AL2, the second antenna element AP2 may be disposed. The first antenna element AP1 and the second antenna element AP2 may include a mesh pattern having a plurality of openings MH. In FIG. 9, a plurality of first antenna elements AP1 and a plurality of second antenna elements AP2 may be disposed to overlap each other. In an embodiment, unlike FIG. 9, the first antenna elements AP1 and the second antenna elements AP2 may be respectively in the first antenna layer AL1 and the second antenna layer AL2 without overlapping each other.

The thickness of the second antenna elements AP2 may be less than the thickness of the first antenna elements AP1. Here, the thickness may correspond to a length in the third direction DR3. A detailed description thereof will be provided with reference to FIG. 10.

Figure 10:
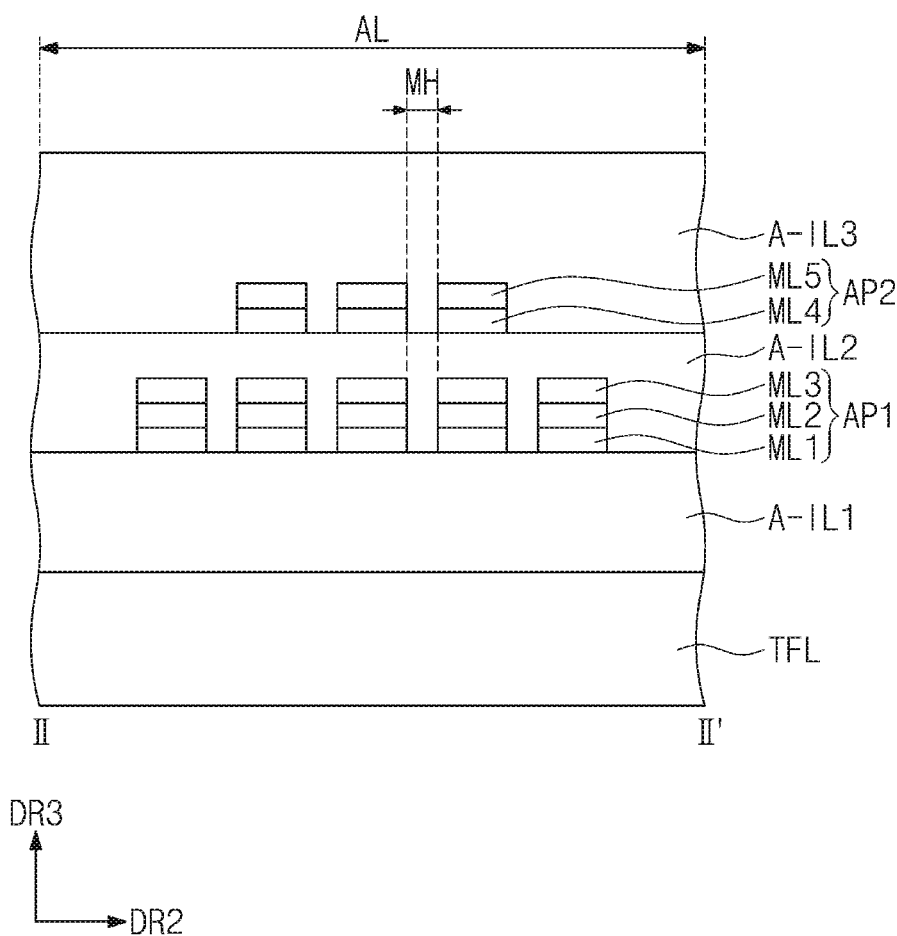
FIG. 10 is a cross-sectional view of an antenna according to an embodiment of the inventive concept.

FIG. 10 is a cross-sectional view of an antenna according to an embodiment of the inventive concept.

Referring to FIG. 10, the first antenna layer AL1 and the second antenna layer AL2 may include a multi-layered metal layer. Although not separately illustrated, in FIG. 10, the first antenna elements AP1 having a three-layer structure of a first metal layer ML1, a second metal layer ML2, and a third metal layer ML3, and the second antenna elements AP2 having a two-layer structure of a fourth metal layer ML4 and a fifth metal layer ML5 are exemplarily illustrated. The first to fifth metal layers ML1 to ML5 may include a mesh pattern having a plurality of openings MH. Each of the first metal layer ML1 to the fifth metal layer ML5 may be a titanium layer or an aluminum layer. In an embodiment, the first metal layer ML1 is a titanium layer, the second metal layer ML2 is an aluminum layer, the third metal layer ML3 is a titanium layer, and the fourth metal layer ML4 and the fifth metal layer ML5 may each be a titanium layer or an aluminum layer. In an embodiment, each of the first metal layer ML1 to the third metal layer ML3 of the first antenna elements AP1 may be formed of a titanium layer, and the second antenna elements AP2 are formed only of the fourth metal layer ML4, wherein the fourth metal layer ML4 may be formed of a titanium layer. Here, the thickness of the plurality of titanium layers and the aluminum layers may be the same. Therefore, the thickness of the second antenna elements AP2 may be less than the thickness of the first antenna elements AP1. For example, the thickness of the second antenna elements AP2 disposed on an upper side of the first antenna elements AP1 to overlap the first antenna elements AP1 may be less than the thickness of the first antenna elements AP1. The second antenna elements AP2 may be formed to be thin to reduce signal interference which may affect the first antenna elements AP1.

Figure 11:
FIG. 11 is a cross-sectional view of an antenna according to an embodiment of the inventive concept.

FIG. 11 is a cross-sectional view of an antenna according to an embodiment of the inventive concept. FIG. 11 is a cross-sectional view taken along line of FIG. 7.

Referring to FIG. 11, the antenna AL may include a plurality of transmission lines passing through the second insulation layer A-IL2 and connecting the first antenna elements AP1 and the second antenna elements AP2, respectively. The plurality of transmission lines may include a first transmission line CNL1, and a second transmission line CNL2 In an embodiment, each of the first antenna elements AP1 may include the first transmission line CNL1, and each of the second antenna elements AP2 may include the second transmission line CNL2. The first transmission line CNL1 and the second transmission line CNL2 may each be connected to the different pad in the third pad unit PD3. In another embodiment, the plurality of transmission lines may further include a contact hole between a first transmission line CNL1 and a second transmission line CNL2. In this embodiment, the first transmission line CNL1 and the second transmission line CNL2 may be connected to the same pad in the third pad unit PD3. In this case, The first transmission line CNL1 and the second transmission line CNL2 may be electrically connected to each other through the contact hole.

Figure 12:
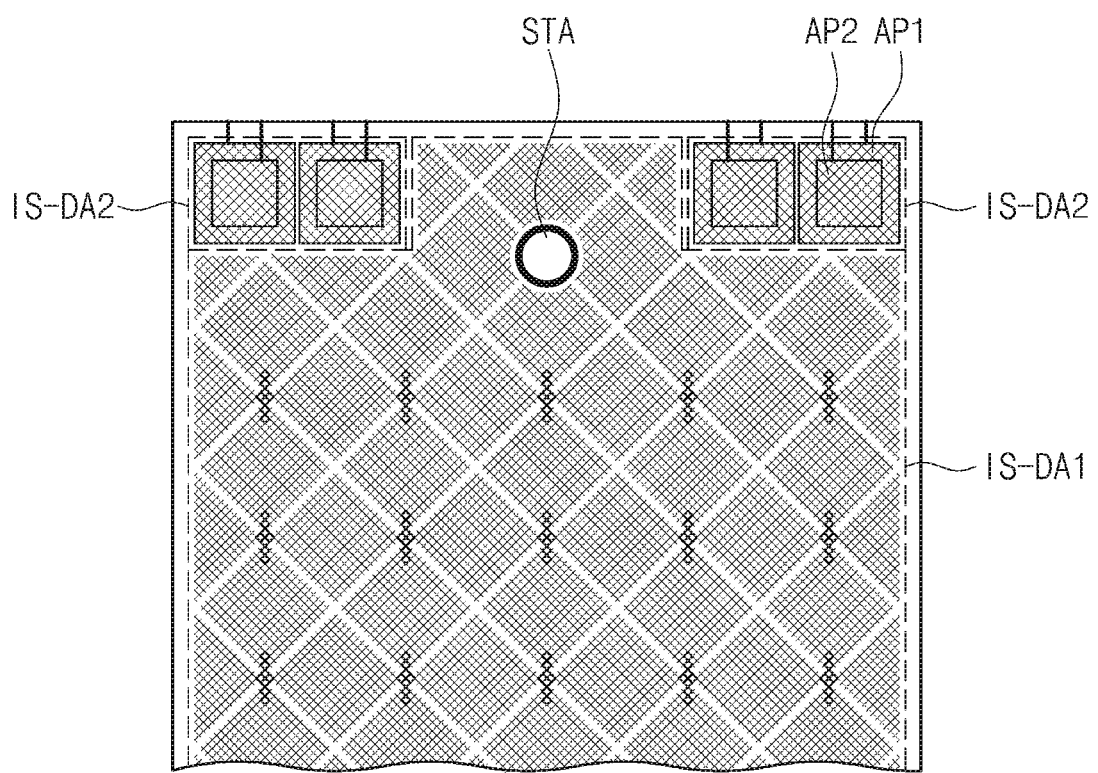
FIG. 12 is a cross-sectional view of an input sensor and an antenna according to an embodiment of the inventive concept.

FIG. 12 is a cross-sectional view of an input sensor and an antenna according to an embodiment of the inventive concept.

In FIG. 12, a display panel may further include a signal transmission region STA. The signal transmission region STA is a region in which a signal of an electronic module such as a camera module (not shown) is transmitted, and corresponds to a non-display region (i.e., a non-display region). In an embodiment, the signal transmission region STA is disposed on an upper portion of a display panel on a plan view, and some regions on the left side and the right side of the signal transmission region STA may be the antenna region IS-DA2 corresponding to the second region DA2 of a display region. A lower side of the signal transmission area STA may correspond to the sensing region IS-DA1 corresponding to the first region DA1 of the display region. For example, a region of the display panel including some regions on the left and right sides of the signal transmission region STA and the lower side thereof is the sensing region IS-DA1 overlapping the first region DP-DA1 (see FIG. 3A) of the display panel, and other regions on the left and right sides of the signal transmission region STA may be the antenna region IS-DA2 overlapping the second region DP-DA2 (see FIG. 3A) of the display panel. In an embodiment, the antenna region IS-DA2 may be present only on the left side or on the right side of the signal transmission region STA. The input sensor ISL may be disposed in the sensing region IS-DA1, and the antenna AL may be disposed in the antenna region IS-DA2. The present invention, however, is not limited thereto. In an embodiment, there may be one or more signal transmission regions STA, and the position of the signal transmission region STA may be disposed in all possible regions including the center, the left and right sides of the upper portion of the display region. In addition, in FIG. 12, two antennas on the left side and two antennas on the right side are illustrated. However, the inventive concept is not limited thereto. The number of antennas is not limited, and different numbers of antennas may be included on the left side and on the right side.

In an embodiment, the sensing region IS-DA1 corresponding to the first region DA1 of FIG. 6A may surround the signal transmission region STA, and the antenna region IS-DA2 corresponding to the second region DA2 of FIG. 6A may be disposed on at least one of an upper left corner region of the display panel and an upper right corner region thereof.

Figure 13:
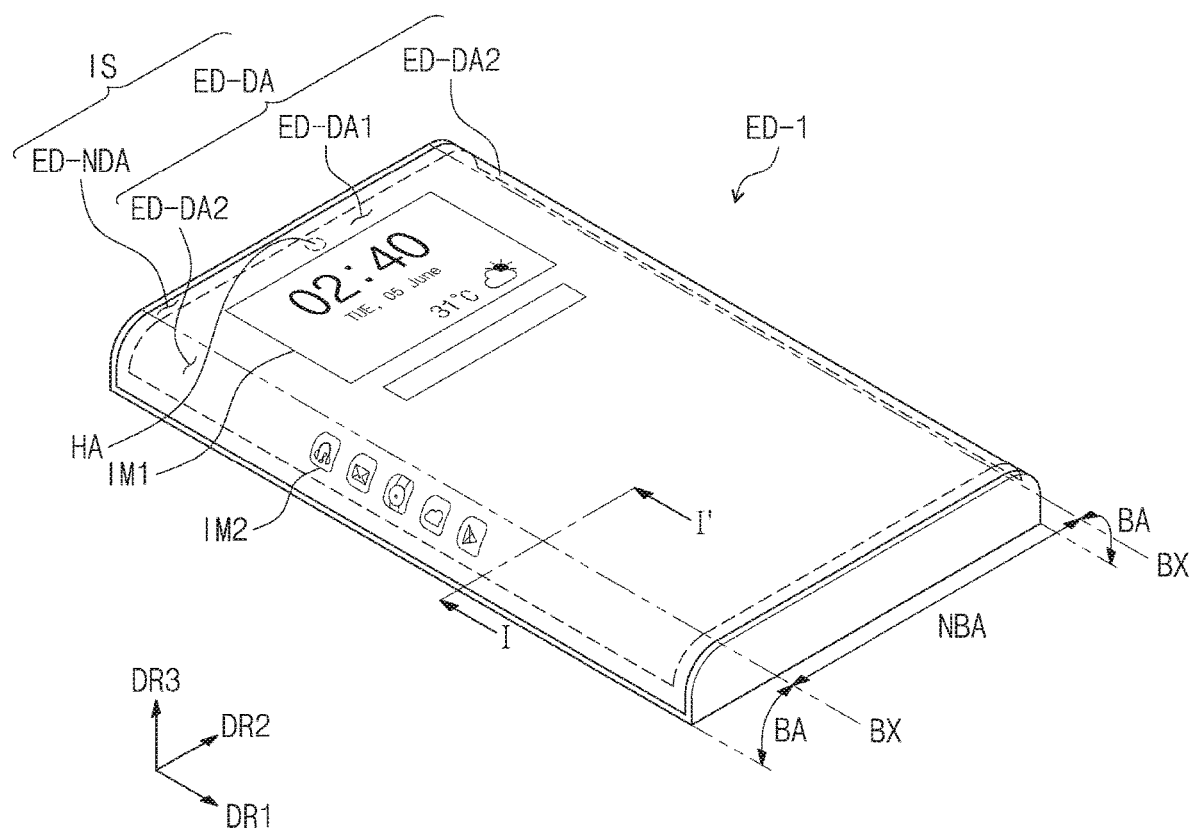
FIG. 13 is a perspective view of an electronic device according to another embodiment of the inventive concept.

FIG. 13 is a perspective view of an electronic device according to an embodiment of the inventive concept.

In FIG. 13, a portable terminal provided with two surfaces having curved edges is exemplarily illustrated. However, the inventive concept is not limited thereto. The edge of one surface may be provided as a curved surface, or the edges of all four surfaces may be provided as curved surfaces. In addition, although not separately illustrated, an electronic device ED-1 according to the inventive concept may be used for large electronic devices such as a television or an external advertisement board, and also for small and medium-sized electronic devices such as a personal computer, a laptop computer, a personal digital terminal, a car navigation unit, a game machine, a portable electronic device, a wristwatch-type electronic device, and a camera. These are merely embodiments, and the display apparatus DD may be employed in other electronic devices without departing from the inventive concept.

The electronic device ED-1 according to an embodiment may have a plurality of regions separated on a display surface IS. In the electronic device ED-1, the image region ED-DA in which first and second images IM1 and IM2 are displayed, the bezel region ED-NDA adjacent to the image region ED-DA, and a hole region HA may be defined. In an embodiment, the bezel region ED-NDA may be omitted. In an embodiment, the image region ED-DA may include a first region ED-DA1 displaying a first image IM1 and a second region ED-DA2 displaying a second image IM2.

In FIG. 13, as an example of the images IM1 and IM2, a watch widget, and the like are illustrated. The bezel region ED-NDA may surround the image region ED-DA. The edge of the hole region HA may be surrounded by the first region ED-DA1. In a plan view, the hole region HA may be spaced apart from the bezel region ED-NDA having the first region ED-DA1 therebetween. The hole region HA is a region in which a module hole (not shown) is defined. Accordingly, the module hole (a camera hole and the like), in a plan view, may be surrounded by the display region DA in which the images IM1 and IM2 are displayed.

The electronic device ED according to an embodiment may include a bending region BA and a non-bending region NBA. The bending region BA may be a region bent based on a bending axis BX. The non-bending region NBA may be a region extended from the bending region BA and flat. The bending region BA may be an edge region of the electronic device ED. The bending region BA may be defined on one side surface and the other side surface, opposite to the one side surface, of the electronic device ED. At this time, the bending region BA defined on one side surface of the electronic device ED may be referred to as a first bending region, and the bending region BA defined on the other side surface of the electronic device ED may be referred to as a second bending region.

The non-bending region NBA may be parallel to a plane defined by a first direction DR1 and a second direction DR2. The normal direction of the electronic device ED is indicated by the third direction DR3. The non-bending region NBA may be a region corresponding to a front surface of the electronic device ED, and the bending region BA may be a region corresponding to a side surface of the electronic device ED.

Figure 14:
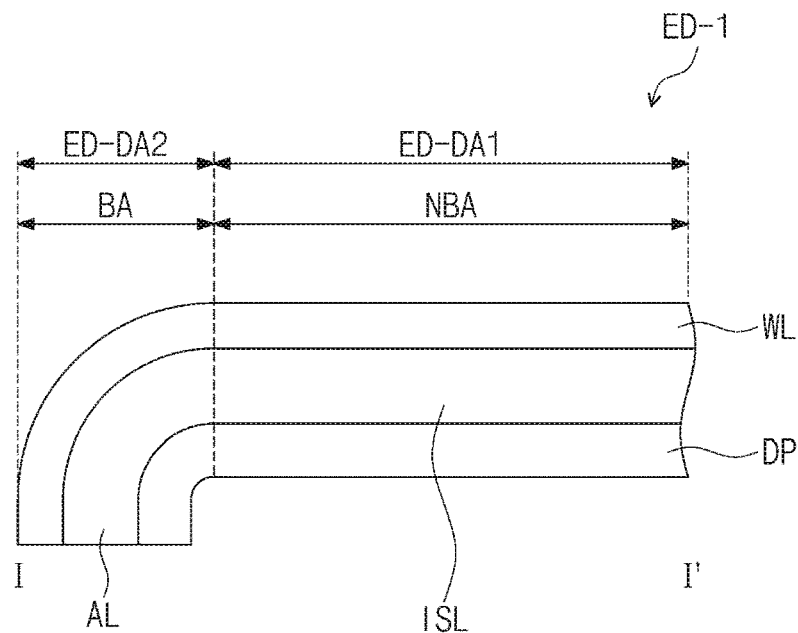
FIG. 14 is a cross-sectional view of a surface taken along line I-I' of FIG. 13.
Figure 15:
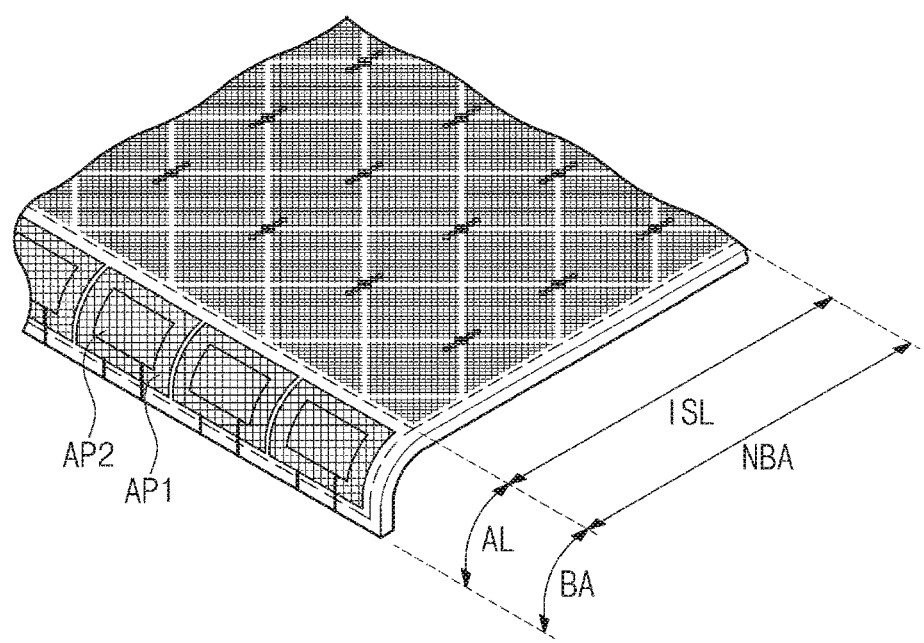
FIG. 15 is a perspective view of an input sensor and an antenna according to an embodiment of the inventive concept.

FIG. 14 is a cross-sectional view of a surface taken along line I-I' of FIG. 13. FIG. 15 is a perspective view of an input sensor and an antenna according to an embodiment of the inventive concept.

Referring to FIG. 14 and FIG. 15, the first region ED-DA1 of the display panel overlaps the non-bending region NBA, and the second region ED-DA2 thereof overlaps the bending region BA. The input sensor ISL may be disposed in the non-bending region NBA overlapping the first region, and the antenna AL may be disposed in the bending region BA overlapping the second region. A redundant description made with reference to FIG. 6A will be omitted. In FIG. 15, each of the first antenna elements AP1 and the second antenna elements AP2 may include a plurality of mesh patterns. The mesh patterns may be formed of silver, lead, or copper. The first and second antenna elements AP1 and AP2 may be disposed in a first bending region or a second bending region, or may be disposed in both the first bending region and the second bending region. For example, although not illustrated in the drawing, the antenna AL may be disposed in both the first and second bending regions on both sides of the input sensor ISL.

In an embodiment, the antenna AL may be spaced apart from the first and second sensor units SP1 and SP2 by at least 1 mm to 2 mm on the second insulation layer IL2 (see FIG. 6B). For example, the first antenna elements AP1 may be spaced apart from the most adjacent first and second sensor units SP1 and SP2 (see FIG. 7) by at least 1 mm. By placing the antenna and the sensor units in the sensing region IS-DA1 (see FIG. 7) and the antenna region IS-DA2 (see FIG. 7) spaced apart from each other, field interference may be reduced.

In an embodiment of the inventive concept, an electronic device may dispose an antenna which provides at least two frequencies different from each other on a region separated from an input sensor in a display region. The antenna may include a plurality of antenna elements disposed to overlap each other in different layers. The plurality of antenna elements may be stacked together with sensor units of the input sensor. In an embodiment of the inventive concept, an antenna may be disposed on a side edge region or a bending region of a display region, or on the left and/or the right side of a signal transmission region, so that problems of signal interference due to a user's touch, user hazard, and deterioration in image quality due to a user's touch.

An electronic device according to the inventive concept may improve antenna efficiency by disposing first and second antennas which provide different frequency bands on two layers in a display region. The first and second antennas of the inventive concept are stacked together with the input sensor, so that the process is efficient. The first and second antennas of the inventive concept have a mesh structure, thereby preventing image quality problems, and have different thicknesses and areas, thereby preventing signal interference and the like.

As described above, the inventive concept have been disclosed in the drawing and the specification. Although specific terms have been used herein, they have been merely used for the purpose of describing the inventive concept, and are not intended to limit the meaning or the scope of the inventive as set forth in the claims. Therefore, it will be understood by those skilled in the art that various modifications and equivalent embodiments may be made therefrom. Therefore, the true technical protection scope of the inventive concept should be determined by the technical spirit of the appended claims.

What is claimed is:

1. An electronic device comprising:
a display panel including a display region and a non-display region adjacent to the display region;
an input sensor overlapping a first region of the display region; and
an antenna overlapping a second region of the display region,
wherein the input sensor includes:
a first sensing layer including a bridge pattern; and
a second sensing layer including a plurality of sensor electrodes and disposed on a different layer from the first sensing layer,
wherein the bridge pattern is configured to connect two adjacent sensor electrodes of the plurality of sensor electrodes, and
wherein the antenna includes:
a first antenna layer including a first antenna with a first frequency band, the first antenna layer and the first sensing layer disposed in the same layer of a first conductive layer; and
a second antenna layer including a second antenna with a second frequency band different from the first frequency band, the second antenna layer and the second sensing layer disposed in the same layer of a second conductive layer, and
wherein one of an area of the first antenna and an area of the second antenna is greater than the other, and the first antenna overlaps the second antenna.

2. The electronic device of claim 1,
wherein the input sensor and the antenna further comprise a first insulation layer and a second insulation layer which covers the bridge pattern and the first antenna layer,
wherein the first antenna layer and the bridge pattern are disposed on the first insulation layer, and
wherein the second antenna layer and the plurality of sensor electrodes are disposed on the second insulation layer.

3. The electronic device of claim 1, further comprising:
a third insulation layer covering the plurality of sensor electrodes and the second antenna layer.

4. The electronic device of claim 1,
wherein the display panel includes a thin film encapsulation layer, and
wherein the input sensor and the antenna are disposed directly on an upper surface of the thin film encapsulation layer.

5. The electronic device of claim 1,
wherein the first antenna layer comprises:
a first metal layer, a second metal layer on the first metal layer, and a third metal layer on the second metal layer, and
wherein the second antenna layer comprises a fourth metal layer and a fifth metal layer on the fourth metal layer.

6. The electronic device of claim 5,
wherein each of the first metal layer and the third metal layer is a titanium layer,
wherein the second metal layer is an aluminum layer, and
wherein each of the fourth metal layer and the fifth metal layer is a titanium layer or an aluminum layer.

7. The electronic device of claim 1,
wherein one of the first frequency band and the second frequency band is smaller than the other.

8. The electronic device of claim 1,
wherein the first antenna layer comprises a plurality of first antennas, and
wherein the second antenna layer comprises a plurality of second antennas.

9. The electronic device of claim 8,
wherein each of the plurality of second antennas overlaps a corresponding first antenna of the plurality of first antennas.

10. The electronic device of claim 8,
wherein a thickness of one of the first antenna layer and the second antenna layer is greater than a thickness of the other.

11. The electronic device of claim 8,
wherein the antenna further comprises a plurality of transmission lines, and
wherein each of the plurality of transmission lines connects a corresponding one of the plurality of first antennas and a corresponding one of the plurality of second antennas.

12. The electronic device of claim 1,
wherein each of the first antenna and the second antenna comprises a mesh pattern.

13. The electronic device of claim 1,
wherein the display panel further comprises a signal transmission region,
wherein on a plan view, the first region surrounds the signal transmission region, and wherein the second region is at least one of an upper left corner region of the display panel and an upper right corner region thereof.

\* \* \* \* \*